United States Patent
Kobayashi et al.

(10) Patent No.: US 9,711,628 B2
(45) Date of Patent: Jul. 18, 2017

(54) SEMICONDUCTOR DEVICE

(71) Applicant: FUJI ELECTRIC CO., LTD., Kawasaki-shi (JP)

(72) Inventors: Yusuke Kobayashi, Matsumoto (JP); Manabu Takei, Shiojiri (JP); Akio Nakagawa, Chigasaki (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 2 days.

(21) Appl. No.: 14/824,027

(22) Filed: Aug. 11, 2015

(65) Prior Publication Data

US 2016/0064476 A1    Mar. 3, 2016

(30) Foreign Application Priority Data

Aug. 27, 2014    (JP) .................................. 2014-173315

(51) Int. Cl.
    *H01L 29/739*     (2006.01)
    *H01L 29/66*      (2006.01)
    (Continued)

(52) U.S. Cl.
    CPC ...... *H01L 29/7397* (2013.01); *H01L 29/0619* (2013.01); *H01L 29/0646* (2013.01);
    (Continued)

(58) Field of Classification Search
None
See application file for complete search history.

(56) References Cited

U.S. PATENT DOCUMENTS

| | | |
|---|---|---|
| 2002/0179976 A1 | 12/2002 | Takahashi |
| 2003/0102486 A1 | 6/2003 | Inoue et al. |

(Continued)

FOREIGN PATENT DOCUMENTS

| | | |
|---|---|---|
| JP | 2001-168333 A | 6/2001 |
| JP | 2002-353456 A | 12/2002 |

(Continued)

OTHER PUBLICATIONS

Norihito Tokura, "Influence of Floating P-Base on Turn-On Characteristics of Trench-Gate FS-IGBT", The Institute of Electrical Engineers of Japan (IEEJ), IEEJ Journal of Industry Applications, vol. 130, No. 6, pp. 728-733, 2010. Relevance can be gleaned from the present specification from pp. 1-7.

(Continued)

*Primary Examiner* — Angel Roman
*Assistant Examiner* — Kevin Quinto
(74) *Attorney, Agent, or Firm* — Rabin & Berdo, P.C.

(57) ABSTRACT

A semiconductor device has a reduced an on-voltage and uses a gate resistance to improve the trade-off relationship between turn-on loss Eon and dV/dt, and turn-on dV/dt controllability. A floating $p^+$-type region is provided in an $n^-$-type drift layer so as to be spaced from a p-type base region configuring a MOS gate structure. An emitter electrode and the floating $p^+$-type region are electrically connected by an $n^+$-type region provided in the surface layer of a substrate front surface. The $n^+$-type region is covered with a second insulating film which film is covered with an emitter electrode. By an electric field being generated in the $n^+$-type region by the emitter electrode provided on the top of the $n^+$-type region via the second interlayer insulating film, the $n^+$-type region forms a current path which causes holes accumulated in the floating $p^+$-type region to flow to the emitter electrode when turning on.

9 Claims, 23 Drawing Sheets

(51) Int. Cl.
    *H01L 29/06*     (2006.01)
    *H01L 29/423*    (2006.01)
(52) U.S. Cl.
    CPC .... *H01L 29/0649* (2013.01); *H01L 29/66348* (2013.01); *H01L 29/42376* (2013.01)

(56) References Cited

U.S. PATENT DOCUMENTS

| | | | |
|---|---|---|---|
| 2005/0045945 A1 | 3/2005 | Yoshikawa et al. | |
| 2011/0193132 A1* | 8/2011 | Kouno | H01L 29/0619 257/139 |
| 2013/0026537 A1 | 1/2013 | Rahimo et al. | |

FOREIGN PATENT DOCUMENTS

| | | |
|---|---|---|
| JP | 2004-335719 A | 11/2004 |
| JP | 2013-522924 A | 6/2013 |

OTHER PUBLICATIONS

Y. Onozawa et al., "Development of the next generation 1200V trench-gate FS-IGBT featuring lower EMI noise and lower switching loss", Proceedings of the 19th International Symposium on Power Semiconductor Devices & ICs, Jeju, Korea, pp. 13-16, May 27 to 30, 2007.

* cited by examiner

SEMICONDUCTOR DEVICE

CROSS-REFERENCE TO RELATED APPLICATION

This non-provisional application for U.S. Letters Patent claims priority from JP PA 2014-173315 filed Aug. 27, 2014, the entire contents of which is hereby incorporated by reference.

BACKGROUND OF THE INVENTION

1. Field of the Invention

The present invention relates to a semiconductor device.

2. Description of the Related Art

As a semiconductor device used as a power semiconductor device, an insulated gate bipolar transistor (IGBT) having a breakdown voltage of 400V, 600V, 1200V, 1700V, 3300V, or more, or the like, is publically known. The IGBT is used in a power conversion device such as a converter or an inverter. This kind of power semiconductor device is required to have a low loss, a high efficiency, and a high withstand capacity, and measures for having a low noise, that is, electro-magnetic compatibility (EMC) are required of the power semiconductor device.

The EMC depends on the time rate of change in voltage (dV/dt), and the dV/dt of free wheeling diodes (FWDs) of opposing arms in a low current region when the IGBT is turned on (when FWDs of opposing arms are reversely recovered) is apt to be highest when the inverter is in operation. Therefore, it is necessary to reduce the dV/dt to an appropriate value by increasing a gate resistance Rg of the IGBT and slowing a turn-on speed, but in this case, turn-on loss Eon of the IGBT increases. Consequently, it is important to improve the trade-off relationship between the turn-on loss Eon and the dV/dt, and improve dV/dt controllability using the gate resistance Rg when the IGBT is turned on (hereafter referred to as turn-on dV/dt controllability).

Next, a description will be given, with a commonly used trench gate IGBT as an example, of a structure of an active region in charge of a current drive of the IGBT. The active region is a region through which a current flows when in an on-state. FIG. 24 is a sectional view showing a structure of a heretofore known trench gage IGBT. As shown in FIG. 24, in the active region, a trench gate type of MOS gate (an insulating gate formed of a metal oxide film semiconductor) structure is provided on the front surface side of an n$^-$-type semiconductor substrate forming an n$^-$-type drift layer 101. Specifically, a trench (hereafter referred to as a gate trench) 102 is provided on the front surface side of the n$^-$-type semiconductor substrate so as to divide the front surface layer of the n$^-$-type drift layer 101. A gate electrode 104 is provided in the inner portion of the gate trench 102 via a gate insulating film 103.

A p-type base region 105 is provided in one of mesa regions of the n$^-$-type drift region 101 divided by the gate trenches 102. An n$^+$-type emitter region 106 is selectively provided, in the front surface layer on the substrate front surface side, in an inner portion of the p-type base region 105. An emitter electrode 107 is in contact with the p-type base region 105 and n$^+$-type emitter region 106 via a contact hole of an interlayer insulating film 108 provided in the substrate front surface, and is electrically insulated from the gate electrode 104 by the interlayer insulating film 108. A p$^+$-type region (hereafter referred to as a floating p$^+$-type region) 109 electrically insulated from the emitter electrode 107 by the interlayer insulating film 108 is provided in a mesa region, in which the n$^+$-type emitter region 106 is not provided, in order to secure a breakdown voltage.

An n-type field stop (FS) layer 110 and a p$^+$-type collector layer 111 are provided on the rear surface side of the n$^-$-type semiconductor substrate. A collector electrode 112 is in contact with the p$^+$-type collector layer 111. In the trench gate IGBT of this kind of heretofore known structure, the potential of the floating p$^+$-type region 109 rises by holes being accumulated in the floating p$^+$-type region 109 when turning on, and a displacement current generated by the rise in potential flows into the gate electrode 104. As the turn-on speed in a period relating to the dV/dt is determined by the inflow of the displacement current, the turn-on dV/dt controllability deteriorates (for example, refer to Non-Patent Literature 1: N. Tokura, Influence of Floating P-Base on Turn-On Characteristics of Trench-Gate FS-IGBT, The Institute of Electrical Engineers of Japan (IEEJ), IEEJ Journal of Industry Applications, Vol. 130, No. 6, pp. 728-733, 2010, and to Non-Patent Literature 2: Y. Onozawa and five others, Development of the next generation 1200V trench-gate FS-IGBT featuring lower EMI noise and lower switching loss, and Proceedings of the 19$^{th}$ International Symposium on Power Semiconductor Devices & ICs, Jeju Island, pp. 13-16, May 27 to 30, 2007)

As a device wherein the trade-off relationship, between the turn-on loss Eon and the dV/dt, and the turn-on dV/dt controllability are improved, the following device is proposed. A first groove and a second groove are formed so as to pass through a p-type base layer and n-type layer and reach the upper layer portion of an n$^-$-type layer. The first groove is adjacent to an N$^+$-type emitter region, and a gate electrode is formed in the inner portion of the first groove. A polysilicon region is formed in the inner portion of the second groove. The second groove is different from the first groove in that no N$^+$-type emitter region is formed in a region in the vicinity of the second groove, and in that no gate electrode is formed in the inner portion of the second groove (for example, refer to JP-A-2002-353456). In JP-A-2002-353456, by forming a dummy gate structure wherein the polysilicon region of emitter potential is provided in the inner portion of the second groove via an insulating film, holes accumulated in the p-type base layer are drawn out to an emitter electrode when in off operation, thus improving off-operation characteristics.

Next, a description will be given of a structure of the active region of the trench gate IGBT including the dummy gate structure. FIG. 25 is a sectional view showing another example of the structure of the heretofore known trench gate IGBT. The trench gate IGBT including the dummy gate structure shown in FIG. 25 includes a trench gate type of MOS gate structure, in the same way as the commonly used trench gate IGBT shown in FIG. 24. Further, a trench (hereafter referred to as an emitter trench) 122 is provided, so as to be adjacent to the trench (gate trench) 102 configuring the MOS gate structure, with the p-type base region 105 between the trench 122 and the adjacent trench 102. An electrode (a dummy gate electrode) 124 of emitter potential is provided in the inner portion of the emitter trench 122 via an insulating film (a dummy gate insulating film) 123.

Components of the trench gate IGBT including the dummy gate structure, other than the emitter trench 122, dummy gate insulating film 123, and dummy gate electrode 124, are the same as those of the commonly used trench gate IGBT shown in FIG. 24. In the trench gate IGBT including the dummy gate structure, holes are accumulated along the emitter trench 122, in particular, when at a high voltage such as when in an early turn-on stage, a low-resistance current path which causes a hole current to flow from the floating p$^+$-type region 109 to the emitter electrode 107 is formed. Therefore, it is possible to suppress a rise in the potential of the floating p$^+$-type region 109, and thus possible to improve the trade-off relationship, between the turn-on loss Eon and the dV/dt, and the turn-on dV/dt controllability using the gate resistance Rg, compared with in the commonly used trench gate IGBT.

However, in the trench gate IGBT including the dummy gate structure, holes are apt to be accumulated in the vicinity of the emitter trench 122, rather than in the vicinity of the gate trench 102, even when at a low voltage such as when in an on-state, thus reducing a resistance relative to the hole current which passes through the p-type base region 105. Therefore, there is the problem that an injection enhancement (IE) effect decreases, thus promoting an increase in the on-voltage. Also, as it is not possible to carry out the screening of the dummy gate insulating film 123 provided along the inner wall of the emitter trench 122, there is the problem that it is difficult to detect a defect of the dummy gate insulating film 123 using a test for detecting a device including an initial detect.

As a device wherein the trade-off relationship, between the turn-on loss Eon and the dV/dt, and the turn-on dV/dt controllability using the gate resistance Rg are improved without providing an emitter trench, a device wherein a second source region is not connected directly to an emitter electrode, due to which a channel for causing charge carriers to flow from the emitter electrode to a drift layer through the second source region and a second base layer is not formed in the second base layer, is proposed (for example, refer to JP-T-2013-522924).

Also, as another device, the following device is proposed. A pair of main trenches are formed so as to pass through a p-type base layer and reach an n-type base layer. A pair of n-type emitter layers are formed, on the front surface of the p-type base layer, in a current path region sandwiched between the main trenches. A narrowed trench is formed between the pair of n-type emitter layers so as to pass through the p-type base layer and reach the n-type base layer. The narrowed trench is such that hole discharge resistance is increased by narrowing a hole discharge path formed from the n-type base layer to the emitter electrode through the p-type base layer (for example, refer to JP-A-2001-168333).

Also, as another device, the following device is proposed. A sub-well region is provided in one portion of a region of an emitter side surface sandwiched between trench gates, and the sub-well region is connected to an emitter electrode via a diode. The diode is placed in a non-continuity state when an IGBT is in an on-state, and the sub-well region is insulated from the emitter electrode, thereby accumulating carriers. The diode is placed in a continuity state when the IGBT is in an off-state, and the sub-well region is electrically connected to the emitter electrode, thereby discharging carriers at a high speed. In an early turn-on stage, the capacity of a gate portion facing the sub-well region is set to a gate-emitter capacity, thereby reducing a gate-collector capacity and reducing the electromagnetic noise when switching (for example, refer to JP-A-2004-335719).

However, when the emitter trench 122 is not provided, the structure positively using the low-resistance current path which causes the holes accumulated in the floating p$^+$-type region 109 to flow to the emitter electrode 107 when turning on is not formed. Therefore, the IE effect is apt to be impaired to the same degree as or more than in the trench gate IGBT including the dummy gate structure, and it is difficult to strike a balance between a reduction in the on-voltage and an improvement in the trade-off relationship between the turn-on loss Eon and the dV/dt.

In order to solve the heretofore described problems due to the heretofore known technologies, the invention has for its object to provide a semiconductor device wherein it is possible to reduce an on-voltage and improve the trade-off relationship, between turn-on loss Eon and dV/dt, and turn-on dV/dt controllability using a gate resistance Rg.

SUMMARY OF THE INVENTION

In order to solve the heretofore described problems and achieve the object of the invention, a semiconductor device according to the invention has the following features. A first trench is provided to a predetermined depth in a depth direction from one principal surface of a first conductivity type first semiconductor layer. A gate electrode is provided in the inner portion of the first trench via a first insulating film. A second conductivity type first semiconductor region is provided in the surface layer of the one principal surface of the first semiconductor layer so as to have a depth shallower than that of the first trench and to be in contact with the first insulating film provided on the sidewall of the first trench. A first conductivity type second semiconductor region is provided in an inner portion of the first semiconductor region. A second conductivity type third semiconductor region is provided, spaced from the first semiconductor region, in the surface layer of the one principal surface of the first semiconductor layer. A first conductivity type fourth semiconductor region, higher in impurity concentration than the first semiconductor layer, or a second conductivity type fourth semiconductor region, lower in impurity concentration than the third semiconductor region, is provided in the surface layer of the one principal surface of the first semiconductor layer so as to be in contact with the first semiconductor region and third semiconductor region. A second insulating film covering the fourth semiconductor region is provided. A first electrode is provided on the top of the second insulating film. The first electrode is in contact with the first semiconductor region and second semiconductor region. A second conductivity type second semiconductor layer is provided on the other principal surface of the first semiconductor layer. A second electrode is in contact with the second semiconductor layer.

Also, the semiconductor device according to the invention, in the aspect of the invention, further has the following features. A second trench is provided between the first semiconductor region and the third semiconductor region. An insulating layer in contact with the first semiconductor region, third semiconductor region, and first semiconductor layer is provided in the inner portion of the second trench. The fourth semiconductor region is provided, on the top of the insulating layer, in the inner portion of the second trench.

Also, the semiconductor device according to the invention is such that in the heretofore described aspect of the invention, the width of the second trench is 1.5 μm or less.

Also, the semiconductor device according to the invention is such that in the heretofore described aspect of the invention, the depth of the second trench is 6.0 μm or less.

Also, the semiconductor device according to the invention is such that in the heretofore described aspect of the invention, the depth of the first trench is 6.0 μm or less.

Also, the semiconductor device according to the invention is such that in the heretofore described aspect of the invention, the thickness of the second insulating film is 0.2 μm or less.

Also, the semiconductor device according to the invention is such that in the heretofore described aspect of the invention, the fourth semiconductor region is of a first conductivity type, and the impurity concentration of the fourth semiconductor region is $1.0 \times 10^{15}/cm^3$ or more and $1.0 \times 10^{19}/cm^3$ or less.

Also, the semiconductor device according to the invention is such that in the heretofore described aspect of the invention, the fourth semiconductor region is of a second conductivity type, and the impurity concentration of the fourth semiconductor region is $1.0 \times 10^{18}/cm^3$ or more and $1.0 \times 10^{19}/cm^3$ or less.

Also, in order to solve the heretofore described problems and achieve the object of the invention, a semiconductor device according to the invention has the following features. A plurality of first trenches are provided to a predetermined depth in a depth direction from one principal surface of a first conductivity type first semiconductor layer. A gate electrode is provided in the inner portion of each first trench via a first insulating film. A second conductivity type first semiconductor region is provided in a region, of the surface layer of the one principal surface of the first semiconductor layer, isolated by the first trenches. A first conductivity type second semiconductor region is provided in an inner portion of the first semiconductor region. A second conductivity type third semiconductor region is provided in the surface layer of the one principal surface of the first semiconductor layer. The third semiconductor region is isolated from the first semiconductor region by the first trenches. A second trench is provided in an inner portion of the third semiconductor region. An insulating layer is provided in the inner portion of the second trench. A first conductivity type fourth semiconductor region, higher in impurity concentration than the first semiconductor layer, is provided on the top of the insulating layer, in the inner portion of the second trench, so as to be in contact with the third semiconductor region. A second insulating film covering the fourth semiconductor region is provided. A first electrode is provided on the top of the second insulating film. The first electrode is in contact with the first semiconductor region and second semiconductor region, and is electrically connected to the fourth semiconductor region. A second conductivity type second conductor layer is provided on the other principal surface of the first semiconductor layer. A second electrode is in contact with the second semiconductor layer.

Also, the semiconductor device according to the invention is such that in the heretofore described aspect of the invention, the fourth semiconductor region is in contact with the first electrode.

Also, the semiconductor device according to the invention, in the heretofore described aspect of the invention, further includes a second conductivity type fifth semiconductor region which is provided on the top of the insulating layer, in the inner portion of the second trench, so as to be in contact with the fourth semiconductor region, and is in contact with the first electrode, wherein the fourth semiconductor region is electrically connected to the first electrode via the fifth semiconductor region.

Also, the semiconductor device according to the invention is such that in the heretofore described aspect of the invention, the thickness of the second insulating film is 0.005 μm or more and 0.2 μm or less.

Also, the semiconductor device according to the invention is such that in the heretofore described aspect of the invention, the depth of the second trench is 6.0 μm or less.

Also, the semiconductor device according to the invention is such that in the heretofore described aspect of the invention, the depth of the first trench is 6.0 μm or less.

Also, the semiconductor device according to the invention is such that in the heretofore described aspect of the invention, the impurity concentration of the fourth semiconductor region is $1.0 \times 10^{15}/cm^3$ or more and $1.0 \times 10^{19}/cm^3$ or less.

According to the heretofore described aspects of the invention, the fourth semiconductor region provided immediately below the first electrode can be formed as a current path, which causes holes accumulated in the third semiconductor region to flow to the first electrode when turning on, by a potential of the first electrode lower than that of the gate electrode. By so doing, it is possible to form a current path leading from the third semiconductor region to the emitter electrode when turning on, even without providing a dummy gate structure (an emitter trench) of emitter potential, as heretofore known, and thus possible to improve the trade-off relationship, between the turn-on loss Eon and the dV/dt, and the turn-on dV/dt controllability using the gate resistance Rg. Also, according to the heretofore described aspects of the invention, when in an on-state, the current path of a hole current flowing toward the first electrode from the third semiconductor region via the fourth semiconductor region becomes a high resistance owing to the pn junction between the third semiconductor region and the fourth semiconductor region. Therefore, a flow of the hole current into the first electrode from the third semiconductor region is blocked, and it is thus possible to prevent an IE effect from being impaired. Therefore, it is possible to enhance the IE effect, compared with in the heretofore known structure including the dummy gate structure, and thus possible to further reduce the on-voltage.

According to the semiconductor device according to the invention, the advantageous effect that it is possible to reduce the on-voltage and improve the trade-off relationship, between the turn-on loss Eon and the dV/dt, and the turn-on dV/dt controllability using the gate resistance Rg, is produced.

DETAILED DESCRIPTION OF THE INVENTION

Hereafter, a detailed description will be given, referring to the accompanying drawings, of preferred embodiments of a semiconductor device according to the invention. In the present specification and the accompanying drawings, n or p in layers and regions prefixed with n or p means respectively that electrons or holes are majority carriers. Also, + and − suffixed to n or p respectively mean a higher impurity concentration and lower impurity concentration than in layers and regions affixed with neither + nor −. In the following description of the embodiments and the accompanying drawings, the same signs are given to like components, thus omitting a redundant description.

First Embodiment

Figure 1:
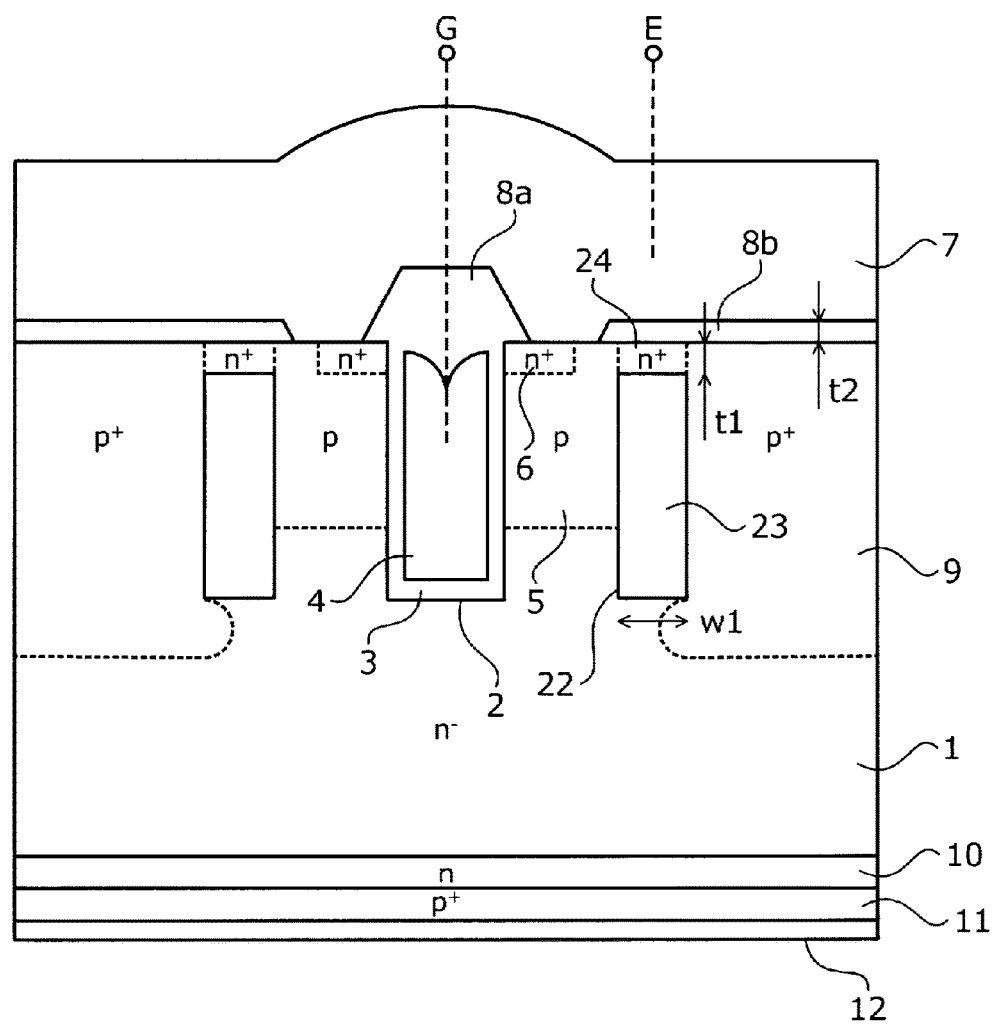
FIG. 1 is a sectional view showing a structure of a semiconductor device according to a first embodiment.

A description will be given of a structure of a semiconductor device according to a first embodiment. FIG. 1 is a sectional view showing a structure of the semiconductor device according to the first embodiment. FIG. 1 shows a structure of an active region (a region through which a current flows when in an on-state) in charge of a current drive, but a breakdown voltage structure portion (not shown) surrounding the periphery of the active region may be disposed in the outer periphery of a semiconductor substrate (a semiconductor chip). The breakdown voltage structure portion, being a region which relaxes an electric field on the substrate front surface side of an $n^-$-type drift layer 1 and holds a breakdown voltage, has a breakdown voltage structure into which, for example, a guard ring, a field plate, and a RESURF are combined.

As shown in FIG. 1, in the active region, a trench gate type of MOS gate structure is provided on the front surface side of an $n^-$-type semiconductor substrate (a semiconductor chip) forming the $n^-$-type drift layer (a first semiconductor layer) 1. An n-type field stop layer 10, a $p^+$-type collector layer (a second semiconductor layer) 11, and a collector electrode (a second electrode) 12 are provided in a commonly used configuration on the rear surface side of the $n^-$-type semiconductor substrate. Hereafter, a detailed description will be given of the MOS gate structure on the substrate front surface side. A first trench (a gate trench) 2 is provided in the $n^-$-type drift layer 1 so as to have a predetermined depth from the substrate front surface. A gate insulating film (a first insulating film) 3 is provided, along the inner wall of the first trench 2, in the inner portion of the first trench 2, and a gate electrode 4 is provided inside the gate insulating film 3.

A p-type base region (a first semiconductor region) 5 is provided in the surface layer on the substrate front surface side of the $n^-$-type drift layer 1 so as to be in contact with the gate insulating film 3 provided on the sidewall of the first trench 2 and have a depth shallower than the first trench 2. An $n^+$-type emitter region (a second semiconductor region) 6 is selectively provided, in the surface layer on the substrate front surface side, in an inner portion of the p-type base region 5. The $n^+$-type emitter region 6 is opposed to the gate electrode 4 with the gate insulating film 3 sandwiched therebetween. An emitter electrode (a first electrode) 7 is in contact with the $n^+$-type emitter region 6 and p-type base region 5, and is electrically insulated from the gate electrode 4 by a first interlayer insulating film 8a. Also, a $p^+$-type region (a floating $p^+$-type region (a third semiconductor region)) 9 electrically insulated from the emitter electrode 7 by a second interlayer insulating film (a second insulating film) 8b is provided in the surface layer on the substrate front surface side of the $n^-$-type drift layer 1.

The floating $p^+$-type region 9 has the function of securing a breakdown voltage. The floating $p^+$-type region 9, being provided spaced from the p-type base region 5, is separated from the p-type base region 5 by at least one pn junction (for example, the pn junction between the floating $p^+$-type region 9 and the $n^-$-type drift layer 1, or the pn junction between the floating $p^+$-type region 9 and an $n^+$-type region 24 to be described hereafter). The depth of the floating $p^+$-type region 9 is deeper than the depth of, for example, a second trench 22 to be described hereafter, and a corner portion on the lower side (substrate rear surface side) of the floating $p^+$-type region 9 extends to immediately below, for example, the bottom surface of the second trench 22.

The second trench 22 is provided between the p-type base region 5 and the floating $p^+$-type region 9 so as to have a depth deeper than the p-type base region 5. The second trench 22 is opposed to the first trench 2 with the p-type base region 5 therebetween. An insulating layer 23 such as an oxide film ($SiO_2$) is provided in the inner portion of the second trench 22, and an $n^+$-type region (a fourth semiconductor region) 24 is provided on the top of the insulating layer 23. That is, the inner portion of the second trench 22 is of a two-layered structure which has a lower layer portion formed of the insulating layer 23 and an upper layer portion formed of the n$^+$-type region 24. The n$^+$-type region 24 is in contact with the p-type base region 5 and floating p$^+$-type region 9. The n$^+$-type region 24 is covered with the second interlayer insulating film 8b of substantially the same thickness as that of the gate insulating film 3. The second interlayer insulating film 8b is covered with the emitter electrode 7.

An electric field is generated in the n$^+$-type region 24 by the emitter electrode 7 provided on the top of the n$^+$-type region 24 via the second interlayer insulating film 8b. Therefore, the n$^+$-type region 24 forms a current path which causes holes accumulated in the floating p$^+$-type region 9 to flow to the emitter electrode 7 when turning on. Also, when in the on-state, the current path of a hole current flowing toward the emitter electrode 7 from the floating p$^+$-type region 9 via the n$^+$-type region 24 becomes a high resistance owing to the pn junction between the n$^+$-type region 24 and the floating p$^+$-type region 9. That is, the n$^+$-type region 24 has the function of blocking a flow of the hole current into the emitter electrode 7 from the floating p$^+$-type region 9 when in the on-state. Therefore, it is possible to prevent an IE effect from being impaired.

Figure 2:
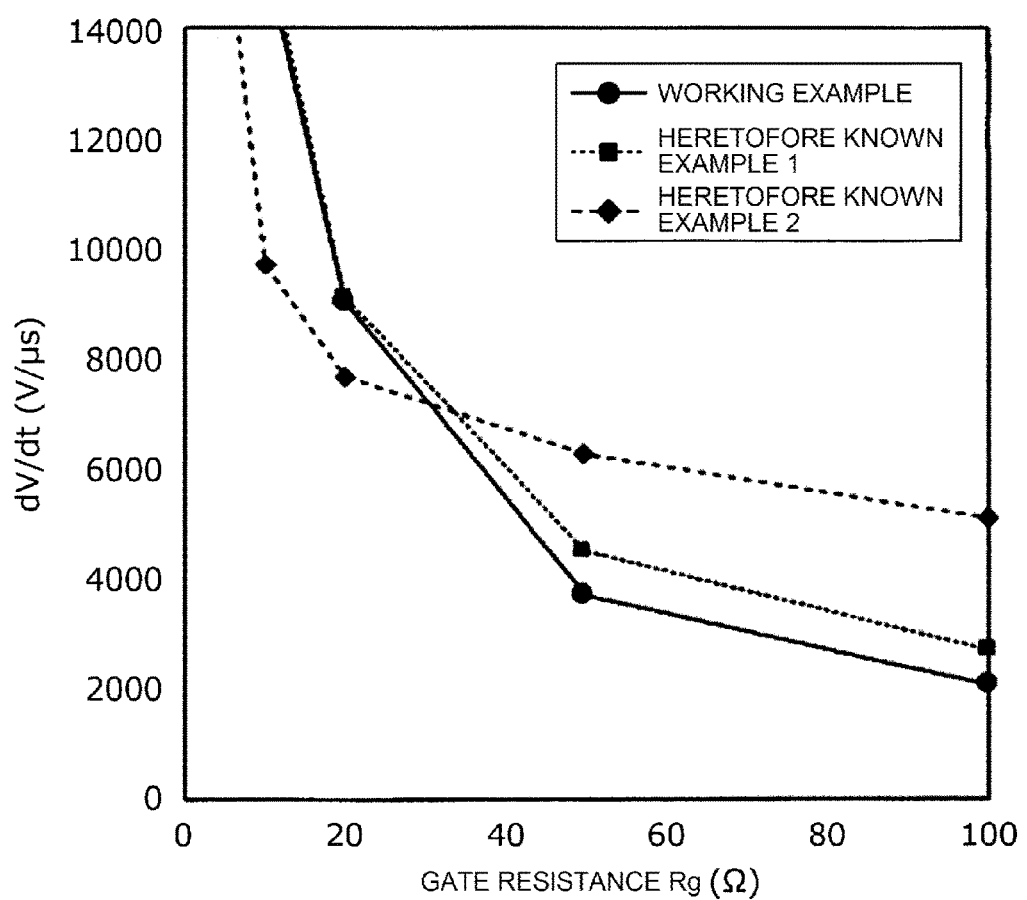
FIG. 2 is a characteristic diagram showing a relationship between a maximum dV/dt of FWDs of opposing arms when an IGBT is turned on and a gate resistance Rg of the IGBT.
Figure 3:
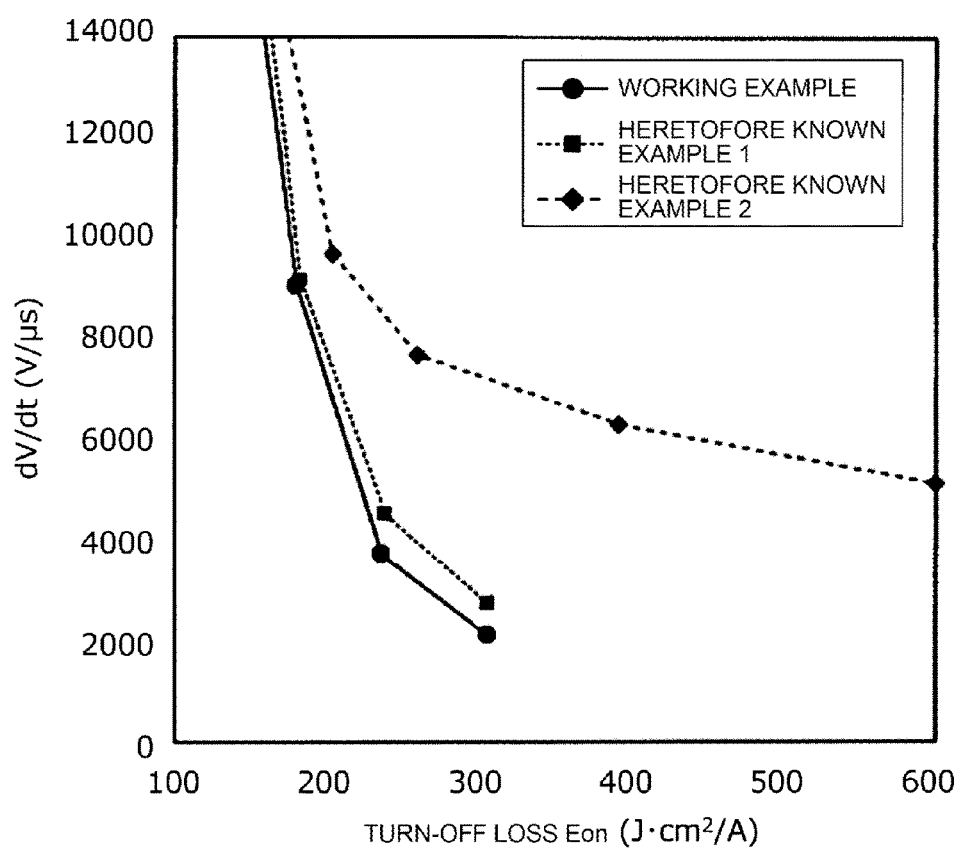
FIG. 3 is a characteristic diagram showing a relationship between the maximum dV/dt of FWDs of opposing arms when the IGBT is turned on and turn-on loss Eon of the IGBT.

Next, a description will be given, in the semiconductor device (an IGBT) according to the first embodiment, of a relationship between dV/dt of FWDs of opposing arms (that is, maximum dV/dt of FWDs of opposing arms when reversely recovered) in a low current region, when the IGBT is turned on when in inverter operation, and gate resistance Rg of the IGBT. Also, a description will be given of a relationship between the dV/dt of FWDs of opposing arms in the low current region, when the IGBT is turned on, and turn-on loss Eon of the IGBT. FIG. 2 is a characteristic diagram showing a relationship between the maximum dV/dt of FWDs of opposing arms, when the IGBT is turned on, and the gate resistance Rg of the IGBT. FIG. 3 is a characteristic diagram showing a relationship between the maximum dV/dt of FWDs of opposing arms, when the IGBT is turned on, and the turn-on loss Eon of the IGBT.

Figure 24:
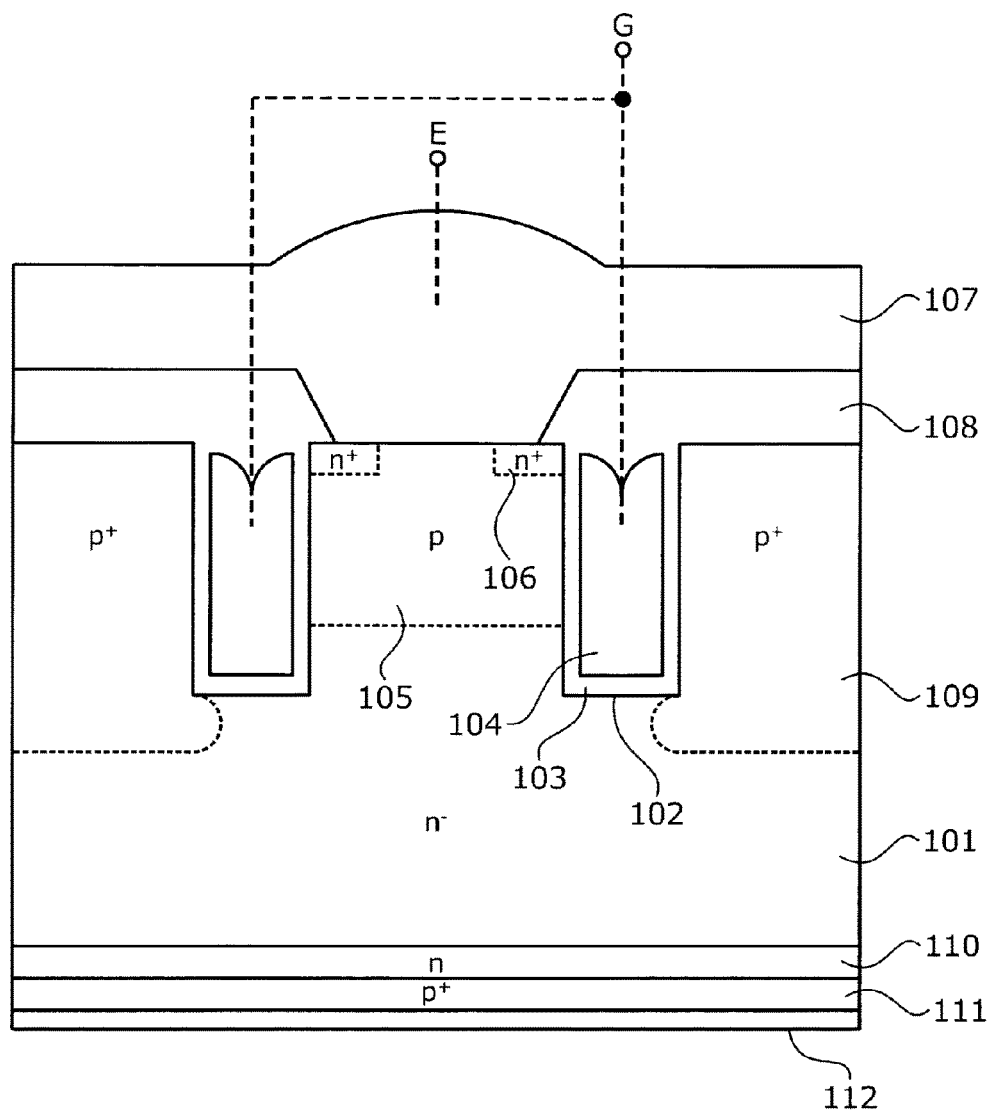
FIG. 24 is a sectional view showing a structure of a heretofore known trench gate IGBT.
Figure 25:
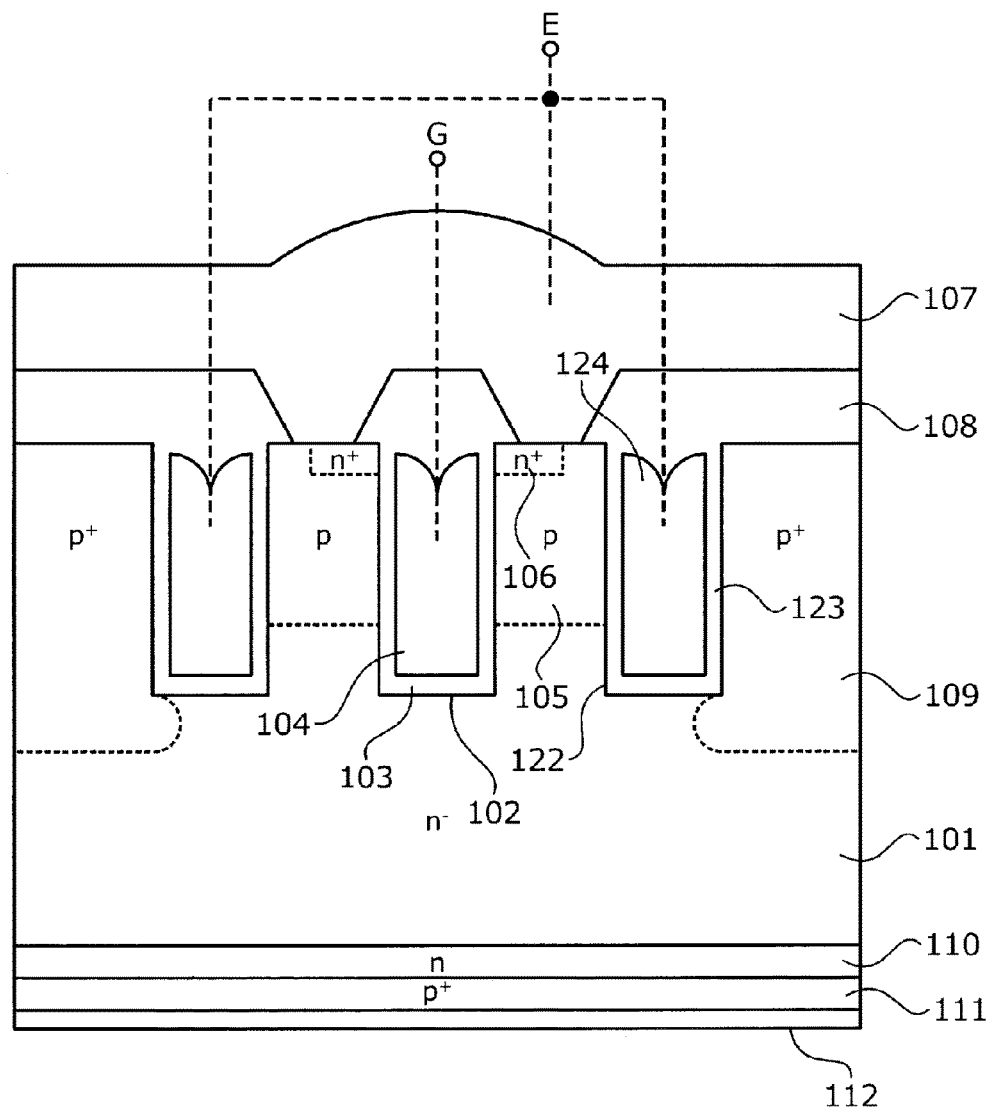
FIG. 25 is a sectional view showing another example of the structure of the heretofore known trench gate IGBT.

FIGS. 2 and 3 show, as comparisons, a trench gate IGBT including a dummy gate structure (refer to FIG. 25: hereafter referred to as a heretofore known example 1) and a commonly used trench gate IGBT (refer to FIG. 24: hereafter referred to as a heretofore known example 2), apart from the semiconductor device according to the first embodiment (hereafter referred to as a working example). In the working example, the width of a mesa region between the first trench 2 and the second trench 22 is set to 1.5 μm. In the heretofore known example 1, the width of a mesa region between a gate trench 102 and an emitter trench 122 is set to 1.5 μm. In the heretofore known example 2, the width of a mesa region between the gate trenches 102 is set to 3.0 μm. It is confirmed, from the results shown in FIGS. 2 and 3, that in the working example, it is possible, even without providing an emitter trench, to improve the trade-off relationship between the turn-on loss Eon and the dV/dt, and the turn-on dV/dt controllability using the gate resistance Rg, to the same degree as in the heretofore known example 1 provided with the emitter trench 122 and compared with in the heretofore known example 2.

Figure 4:
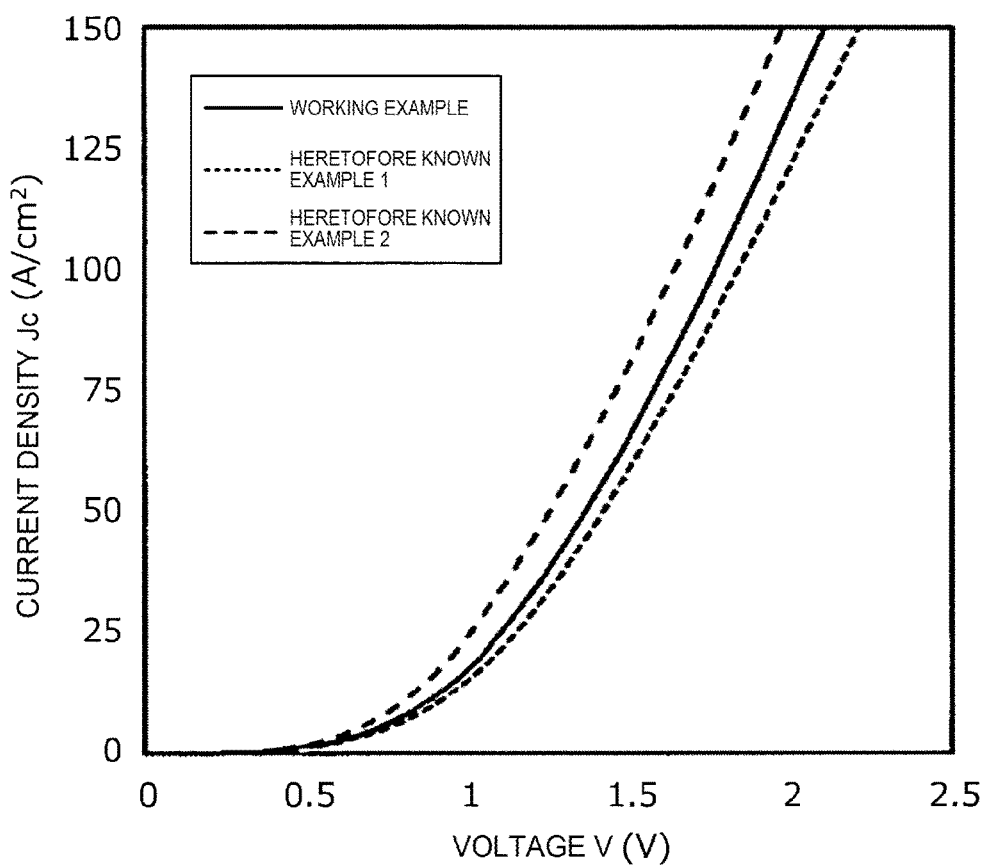
FIG. 4 is a characteristic diagram showing a relationship between a collector current density Jc and voltage V of the IGBT when in an on-state.

FIG. 4 shows current and voltage waveforms when the working example and the heretofore known examples 1 and 2 are in an on-state. FIG. 4 is a characteristic diagram showing a relationship between a collector current density Jc and voltage V of the IGBT when in the on-state. It is confirmed, from the results shown in FIG. 4, that in the working example, the on-voltage is lower, and the IE effect is higher, than in the heretofore known examples 1 and 2. This is because as the n$^+$-type region 24 provided on the top of the insulating layer 23 in the inner side of the second trench 22 is formed as the current path which causes the holes accumulated in the floating p$^+$-type region 9 to flow to the emitter electrode 7 when turning on, the current path is increased in resistance compared with in the heretofore known example 1 with a portion of an n$^-$-type drift layer 101 along the emitter trench 122 as the current path.

In the invention, by variously changing the structure and dimensions of the n$^+$-type region 24, it is possible to easily adjust the resistance value of the current path which causes the holes accumulated in the floating p$^+$-type region 9 to flow to the emitter electrode 7 when turning on. The structure and dimensions of the n$^+$-type region 24 are, specifically, the impurity concentration of the n$^+$-type region 24, a thickness t1 of the n$^+$-type region 24, a width w1 of the second trench 22, a width w2 of the n$^+$-type region 24 relative to the width w1 of the second trench 22, and a thickness t2 of the second interlayer insulating film 8b. A p-type region of an impurity concentration lower than that of the floating p$^+$-type region 9 may be formed in place of the n$^+$-type region 24. By adjusting the resistance value of the current path for each dV/dt required by the semiconductor device, it is possible to easily adjust the on-voltage, the turn-on loss Eon, and the dV/dt to optimum values for the semiconductor device.

Figure 5:
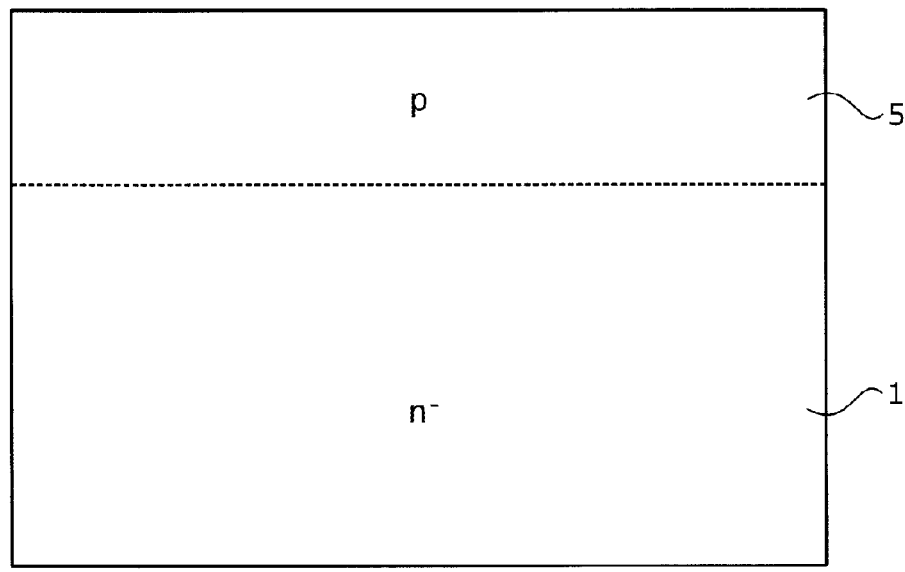
FIG. 5 is a sectional view showing a condition in which the semiconductor device according to the first embodiment is in the process of being manufactured.

Next, a description will be given, with the case of fabricating (manufacturing) an IGBT of a 1200V breakdown voltage level as an example, of a method of manufacturing the semiconductor device according to the first embodiment. FIGS. 5 to 14 are sectional views showing a condition in which the semiconductor device according to the first embodiment is in the process of being manufactured. Firstly, as shown in FIG. 5, for example, boron (B) is ion implanted into an n$^-$-type semiconductor wafer forming the n$^-$-type drift layer 1, and activation anneal (thermal treatment) is performed, thereby forming the p-type base region 5 in the surface layer of the front surface of the semiconductor wafer. Next, thermal treatment (thermal oxidation) is performed in, for example, a water vapor atmosphere, thereby forming an oxide film (for example, a silicon dioxide film (SiO$_2$)) (not shown) on the top of the p-type base region 5. Next, photolithography or etching is performed, thereby removing a portion of the oxide film corresponding to a region in which to form the floating p$^+$-type region 9.

Figure 6:
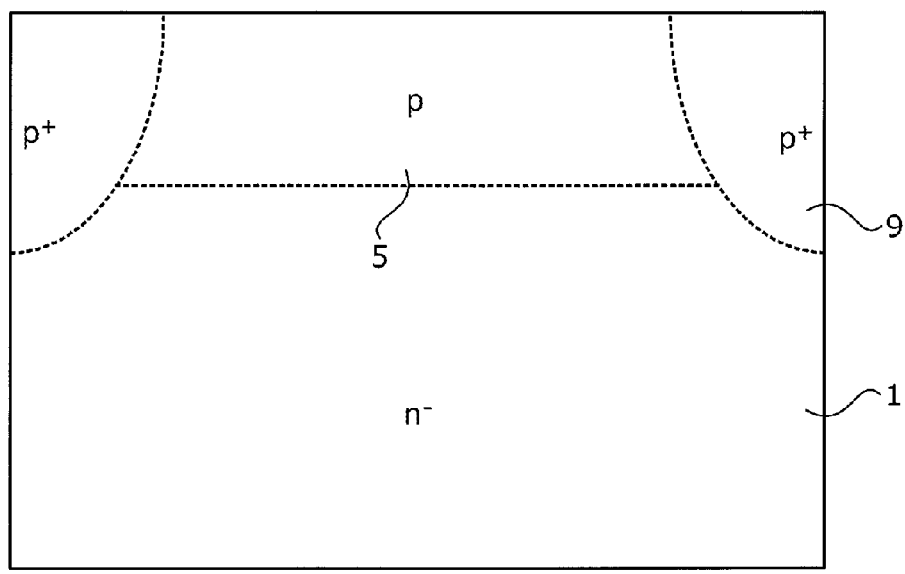
FIG. 6 is a sectional view showing a condition in which the semiconductor device according to the first embodiment is in the process of being manufactured.
Figure 7:
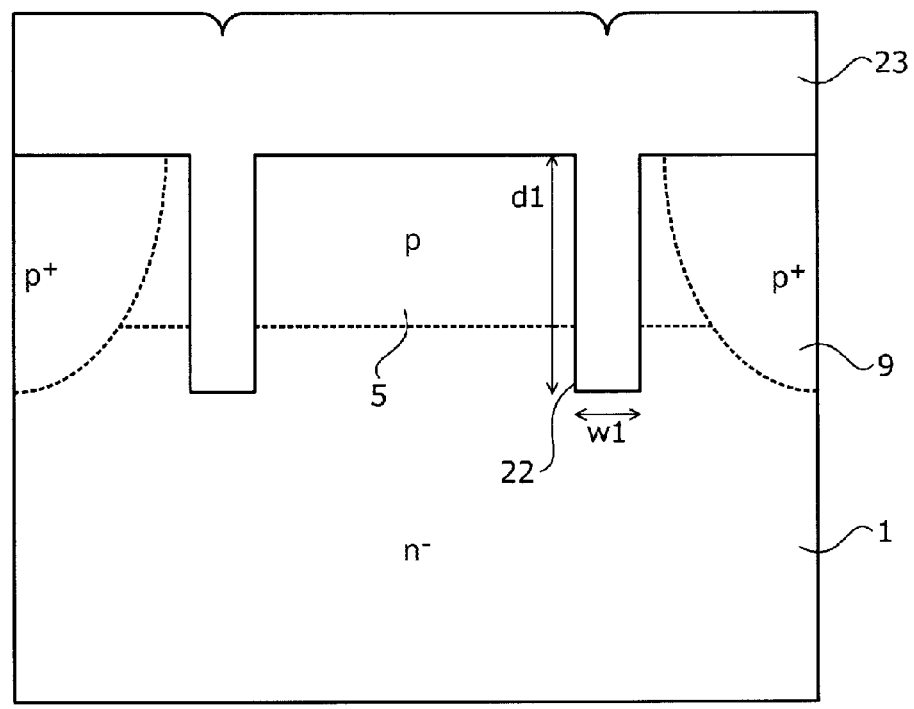
FIG. 7 is a sectional view showing a condition in which the semiconductor device according to the first embodiment is in the process of being manufactured.

Next, for example, boron is ion implanted into the p-type base region 5 with the remaining portion of the oxide film as a mask, thereby forming the floating p$^+$-type region 9, as shown in FIG. 6. Next, after removing the oxide film used as an ion implantation mask, an oxide film (not shown) is formed again on the top of the p-type base region 5 and floating p$^+$-type region 9. Next, a portion of the oxide film corresponding to a region in which to form the second trench 22 is removed by photolithography and etching. Next, as shown in FIG. 7, anisotropic dry etching is carried out with the remaining portion of the oxide film as a mask, thus forming the second trench 22 which passes through the p-type base region 5 and reaches the n$^-$-type drift layer 1. It is good that the width w1 of the second trench 22 is, for example, 0.1 μm or more because a narrow trench is difficult to form, and is on the order of 1.5 μm or less because a wide trench increases in channel density, thus leading to a high on-voltage. A depth d1 of the second trench 22 may be, for example, 1.0 µm or more in order to separate the p-type base region 5 and the floating p$^+$-type region 9, and be, for example, 6.0 µm or less because a deep trench is difficult to form.

Figure 8:
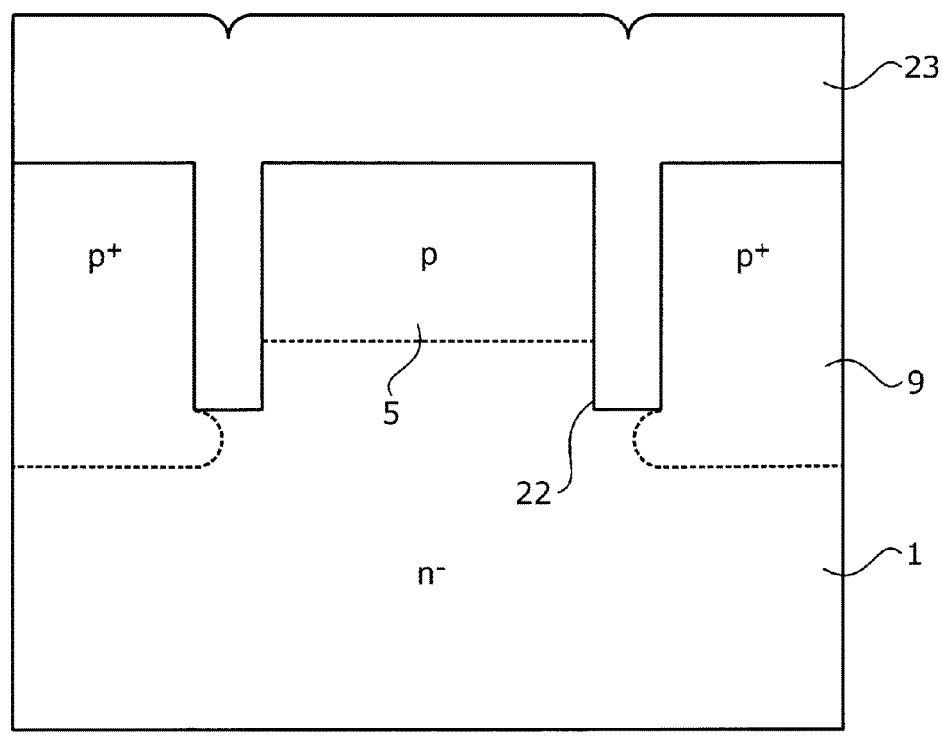
FIG. 8 is a sectional view showing a condition in which the semiconductor device according to the first embodiment is in the process of being manufactured.

Next, an oxide film forming the insulating layer 23 is deposited on the top of the p-type base region 5 and floating p$^+$-type region 9 so as to be embedded in the inner portion of the second trench 22. The insulating layer 23 may be formed by thermal oxide film growth resulting from activation annealing of the floating p$^+$-type region 9, to be described hereafter. Next, as shown in FIG. 8, the floating p$^+$-type region 9 is activated by activation anneal. By so doing, the floating p$^+$-type region 9 is diffused in a direction parallel to the principal surface of the wafer (a horizontal direction) and reaches the sidewall of the second trench 22, and is diffused in a depth direction (a vertical direction) and becomes deeper than the depth of the second trench 22. The p-type base region 5 remains in a portion sandwiched between the adjacent second trenches 22.

Figure 9:
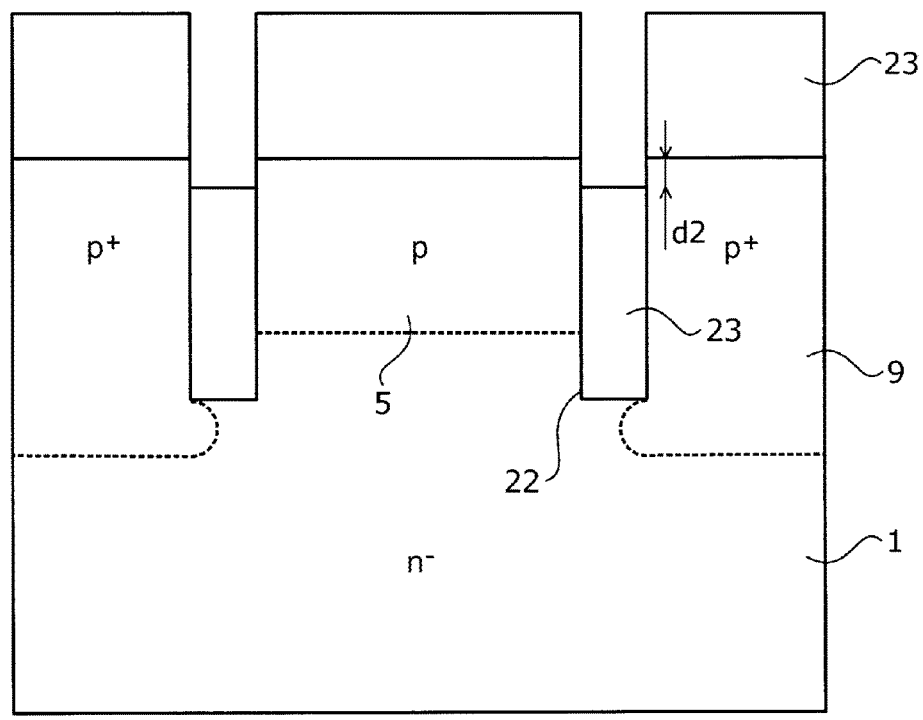
FIG. 9 is a sectional view showing a condition in which the semiconductor device according to the first embodiment is in the process of being manufactured.

Next, as shown in FIG. 9, a portion of the insulating layer 23 on the top of the second trench 22 is removed by photolithography and etching with the insulating layer 23 left in the inner portion of the second trench 22. At this time, the upper surface of the insulating layer 23 left in the inner portion of the second trench 22 is positioned, in the inner portion of the second trench 22, at a depth d2 of, for example, on the order of 0.005 µm or more and 0.2 µm or less from, for example, the front surface of the wafer (the front surfaces of the p-type base region 5 and floating p$^+$-type region 9).

Figure 10:
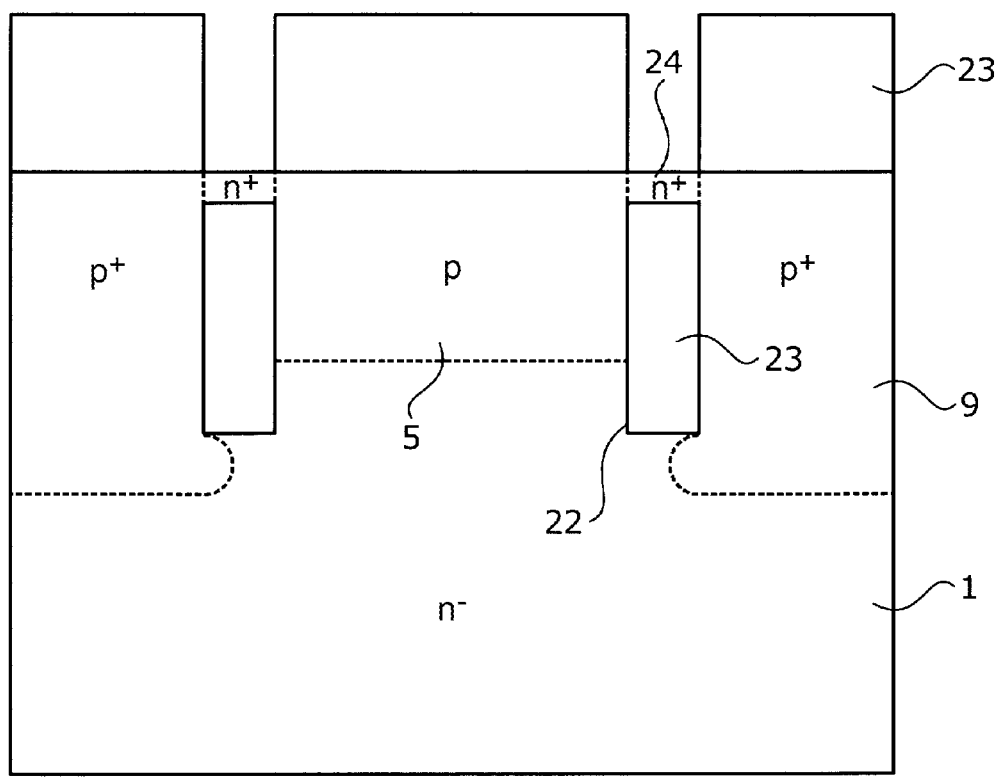
FIG. 10 is a sectional view showing a condition in which the semiconductor device according to the first embodiment is in the process of being manufactured.

Next, as shown in FIG. 10, the n$^+$-type region 24 is formed on the top of the insulating layer 23 remaining in the inner portion of the second trench 22 by epitaxial growth or by depositing a polysilicon (poly-Si) film. The impurity concentration of the n$^+$-type region 24 may be, for example, on the order of $1.0\times10^{15}/cm^3$ or more and $1.0\times10^{19}/cm^3$ or less. When forming a p-type region of an impurity concentration lower than that of the floating p$^+$-type region 9, in place of the n$^+$-type region 24, the impurity concentration of the p-type region may be, for example, on the order of $1.0\times10^{18}/cm^3$ or more and $1.0\times10^{19}/cm^3$ or less.

Figure 11:
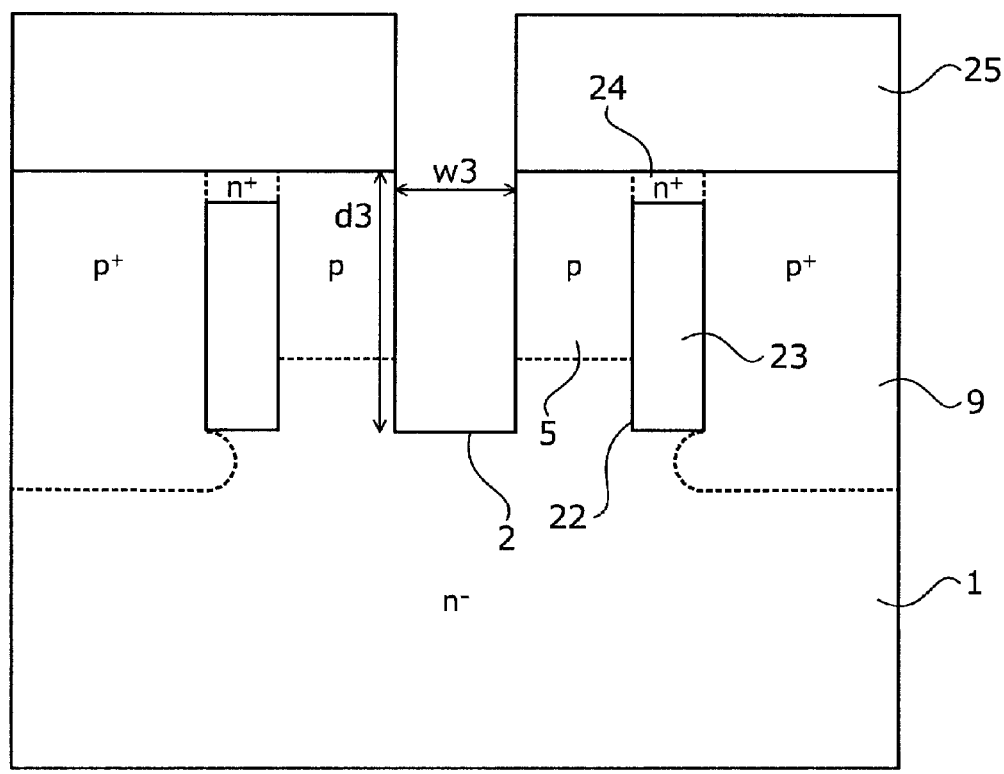
FIG. 11 is a sectional view showing a condition in which the semiconductor device according to the first embodiment is in the process of being manufactured.

Next, as shown in FIG. 11, the insulating layer 23 remaining on the front surface of the wafer (other than the portion of the insulating layer 23 in the inner portion of the second trench 22) is removed, thus forming an oxide film 25 again on the front surface of the wafer. Next, a portion of the oxide film 25 corresponding to a region in which to form the first trench 2 is removed by photolithography and etching. Next, anisotropic etching is performed with the remaining portion of the oxide film 25 as a mask, thus forming the first trench 2 which passes through the p-type base region 5 and reaches the n$^-$-type drift layer 1. A width w3 of the first trench 2 may be, for example, on the order of 0.1 µm or more and 1.5 µm or less. It is good that a depth d3 of the first trench 2 is, for example, 1.0 µm or more because the first trench 2 needs to be deeper than the adjacent p-type base region 5, and the p-type base region 5 needs to be somewhat deep in order to suppress a short channel effect, and that the depth d3 is, for example, on the order of 6.0 µm or less because a deep trench is difficult to form. Further, the remaining portion of the oxide film 25 is removed.

Figure 12:
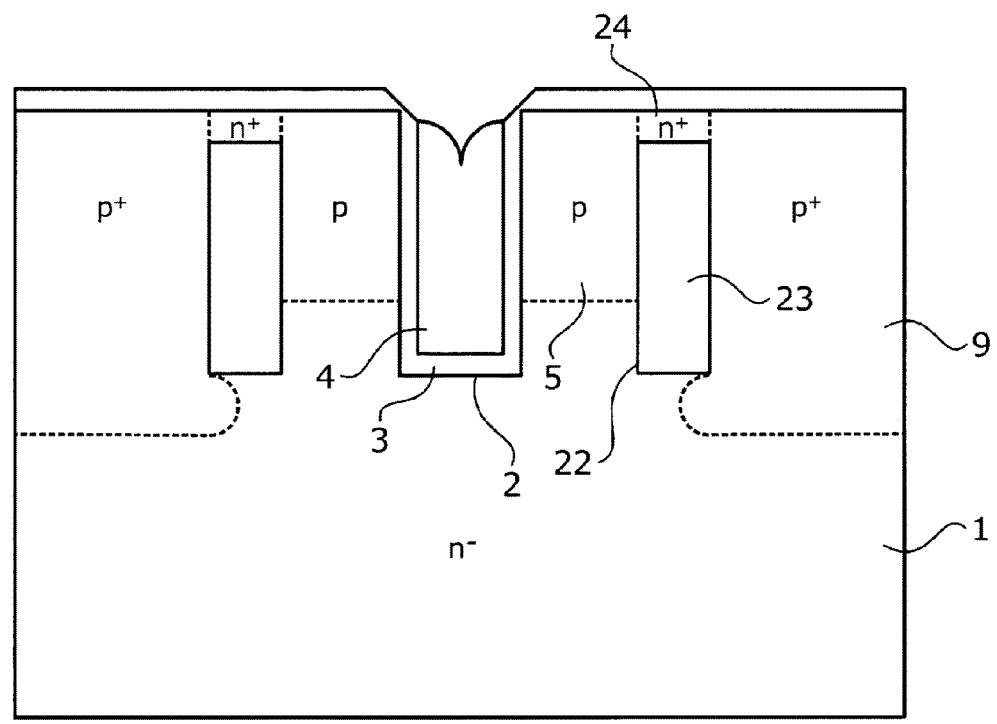
FIG. 12 is a sectional view showing a condition in which the semiconductor device according to the first embodiment is in the process of being manufactured.
Figure 13:
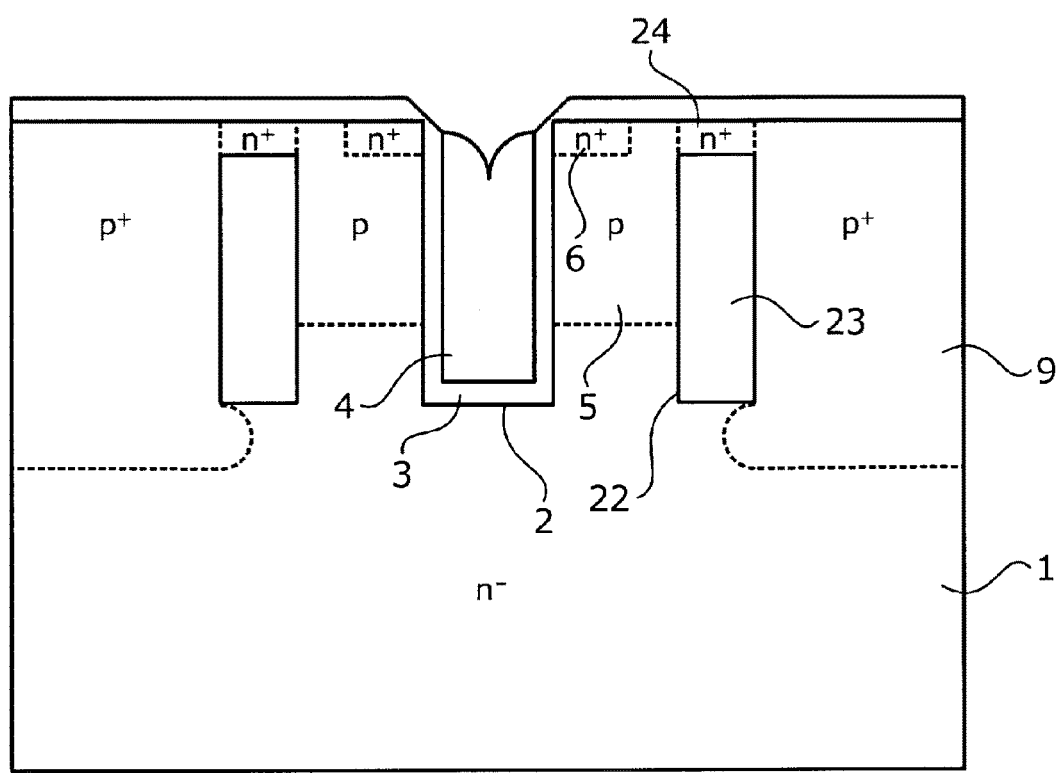
FIG. 13 is a sectional view showing a condition in which the semiconductor device according to the first embodiment is in the process of being manufactured.

Next, as shown in FIG. 12, an oxide film, forming the gate insulating film 3, of a thickness of, for example, on the order of 0.005 µm or more and 0.2 µm or less is formed on the front surface of the wafer and along the inner wall of the first trench 2 by thermal treatment (thermal oxidation). Next, a polysilicon film forming the gate electrode 4 is deposited so as to be embedded in the inner portion of the first trench 2. Next, as shown in FIG. 13, an ion implantation mask (not shown), a portion of which corresponding to a region in which to form the n$^+$-type emitter region 6 is open, is formed on the front surface of the wafer by photolithography and etching. Next, for example, arsenic (As) is ion implanted into the p-type base region 5 with the ion implantation mask as a mask, and activation anneal is performed, thereby selectively forming the n$^+$-type emitter region 6 in the p-type base region 5.

Figure 14:
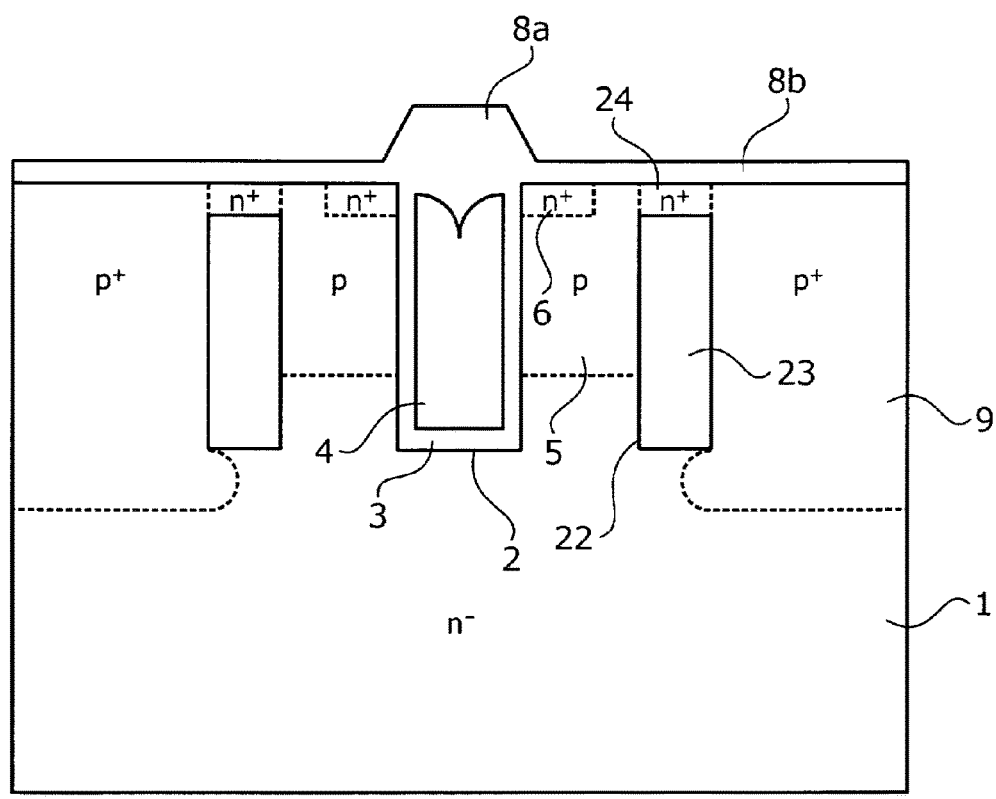
FIG. 14 is a sectional view showing a condition in which the semiconductor device according to the first embodiment is in the process of being manufactured.

Next, as shown in FIG. 14, an oxide film, forming the first interlayer insulating film 8a, of a thickness of, for example, on the order of 0.1 µm or more and 6.0 µm or less is formed on the front surface of the wafer by, for example, a chemical vapor deposition (CVD) method. Next, the first interlayer insulating film 8a is selectively removed by photolithography and etching, thus exposing a silicon surface (the surfaces of the p-type base region 5, n$^+$-type emitter region 6, n$^+$-type region 24, and floating p$^+$-type region 9), and leaving the first interlayer insulating film 8a on the top of the gate electrode 4. Next, an oxide film forming the second interlayer insulating film 8b is formed on the exposed silicon surface of the front surface of the wafer. It is good that the thickness of the second interlayer insulating film 8b is, for example 0.005 µm or more in order to provide a dielectric strength voltage, and is, for example, on the order of 0.2 µm or less in order to increase an electric field flowing from the emitter electrode 7 to the n$^+$-type region 24 via the second interlayer insulating film 8b.

Next, contact holes through which to expose the n$^+$-type emitter region 6 and p-type base region 5 are formed in the first and second interlayer insulating films 8a and 8b by photolithography and etching. Next, the emitter electrode 7 formed of, for example, aluminum (Al) is formed on the surfaces of the first and second interlayer insulating films 8a and 8b so as to be embedded in the inner portions of the contact holes. Next, after protecting the front surface of the wafer with, for example, a resist film, the semiconductor wafer is ground from the rear surface side, thus reducing the thickness of the wafer to a product thickness of, for example, 120 µm used for the semiconductor device.

Next, for example, phosphorus (P), selenium (Se), or proton (H$^+$) is ion implanted into the n$^-$-type drift layer 1 from the ground rear surface of the semiconductor wafer, thereby forming the n-type field stop layer 10 in the surface layer of the ground rear surface of the semiconductor wafer. Next, for example, boron is ion implanted into the n-type field stop layer 10, thereby forming the p$^+$-type collector layer 11 in a position, on the surface layer of the ground rear surface of the semiconductor wafer, shallower than the n-type field stop layer 10. Next, the collector electrode 12 is formed on the p$^+$-type collector layer 11. Subsequently, the semiconductor wafer is diced (cut) into chips, thereby completing the IGBT chip shown in FIG. 1.

As heretofore described, according to the first embodiment, by providing the emitter electrode, via the second interlayer insulating film, on the top of the n$^+$-type region which electrically connect the p-type base region (a channel region) and floating p$^+$-type region, the n$^+$-type region provided immediately below the emitter electrode can be formed as the current path, which causes the holes accumulated in the floating p$^+$-type region to flow to the emitter electrode when turning on, by a potential of the emitter electrode lower than that of the gate electrode. By so doing, it is possible to form a current path leading from the floating p$^+$-type region to the emitter electrode, when turning on, even without providing a dummy gate structure (an emitter trench) of emitter potential, as heretofore known, and thus possible to improve the trade-off relationship, between the turn-on loss Eon and the dV/dt, and the turn-on dV/dt controllability using the gate resistance Rg.

Also, according to the first embodiment, when in the on-state, the current path of the hole current flowing toward the emitter electrode from the floating $p^+$-type region via the $n^+$-type region becomes a high resistance owing to the pn junction between the $n^+$-type region and the floating $p^+$-type region. Therefore, it is possible to block a flow of the hole current into the emitter electrode from the floating $p^+$-type region and prevent the IE effect from being impaired. Therefore, it is possible to enhance the IE effect, compared with in the heretofore known structure including the dummy gate structure, and thus possible to further reduce the on-voltage. Consequently, it is possible to reduce the on-voltage and improve the trade-off relationship, between the turn-on loss Eon and the dV/dt, and the turn-on dV/dt controllability using the gate resistance Rg. Also, according to the first embodiment, by variously changing the structure and dimensions of the $n^+$-type region, it is possible to easily adjust the resistance value of the current path of the hole current flowing toward the emitter electrode from the floating $p^+$-type region via the $n^+$-type region. Therefore, it is possible to easily adjust the on-voltage, the turn-on loss Eon, and the dV/dt to optimum values for the semiconductor device.

Second Embodiment

Figure 15:
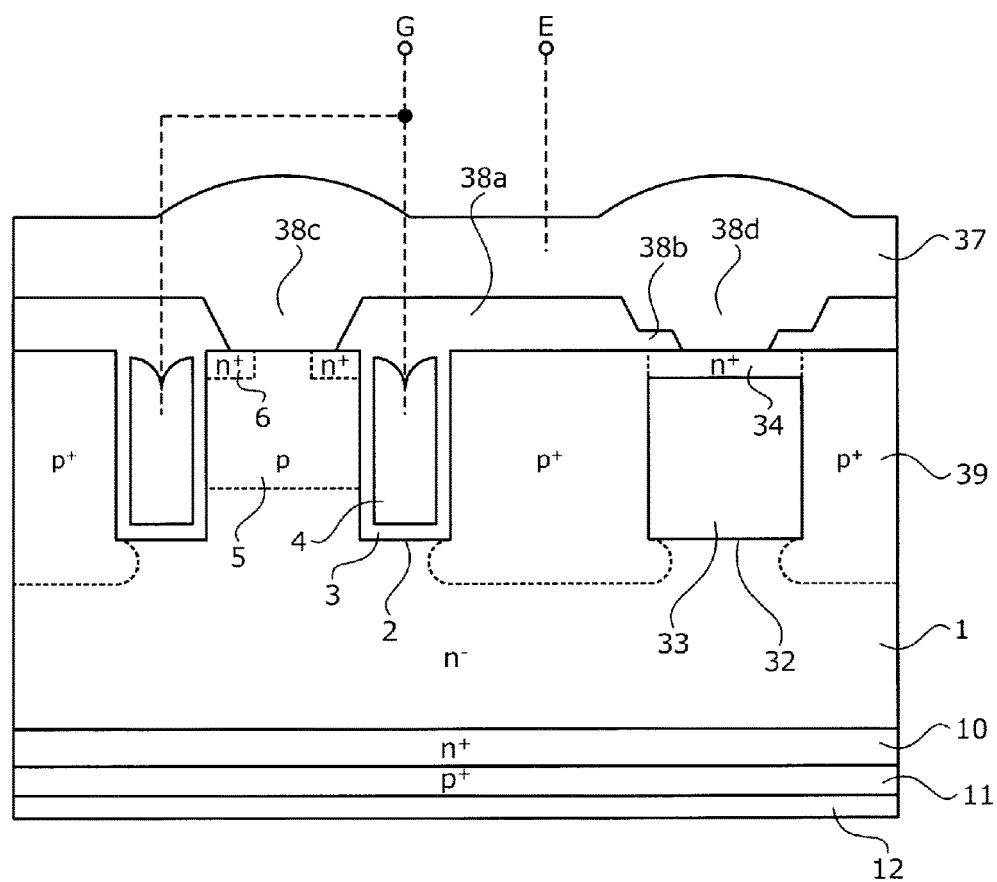
FIG. 15 is a sectional view showing a structure of a semiconductor device according to a second embodiment.

Next, a description will be given of a structure of a semiconductor device according to a second embodiment. FIG. 15 is a sectional view showing a structure of the semiconductor device according to the second embodiment. The semiconductor device according to the second embodiment is different from the semiconductor device according to the first embodiment in that an emitter electrode 37 is in contact with an $n^+$-type region 34 forming a current path for causing holes accumulated in a floating $p^+$-type region 39 to flow to the emitter electrode 37 when turning on. That is, the floating $p^+$-type region 39 and the emitter electrode 37 are electrically connected, by the $n^+$-type region 34 (an upper layer portion) in contact with the floating $p^+$-type region 39 and emitter electrode 37, without by way of the p-type base region (channel region).

Specifically, as shown in FIG. 15, the p-type base region 5 is provided in the mesa region between the first trenches (gate trenches) 2. The floating $p^+$-type region 39 is opposed to the p-type base region 5 with the first trench 2 sandwiched therebetween. A second trench 32 is provided in an inner portion of the floating $p^+$-type region 39 so as to pass through the floating $p^+$-type region 39 and reach the $n^-$-type drift layer 1. An insulating layer 33 is provided, as a lower layer portion, in the inner portion of the second trench 32, and the $n^+$-type region 34 is provided, as the upper layer portion, on the top of the insulating layer 33.

A first interlayer insulating film 38a covers substantially the whole of the front surface of the substrate (chip). A first contact hole 38c through which to expose the $n^+$-type emitter region 6 and p-type base region 5 is provided in the first interlayer insulating film 38a. A second interlayer insulating film 38b of a thickness substantially the same as that of the gate insulating film 3 is provided on the top of the $n^+$-type region 34. A second contact hole 38d through which to expose the $n^+$-type region 34 is provided in the second interlayer insulating film 38b. The emitter electrode 37 is in contact with the $n^+$-type emitter region 6 and p-type base region 5 via the first contact hole 38c, and is in contact with the $n^+$-type region 34 via the second contact hole 38d. Also, the emitter electrode 37 is electrically insulated from the gate electrode 4 and floating $p^+$-type region 39 by the first interlayer insulating film 38a.

Figure 16:
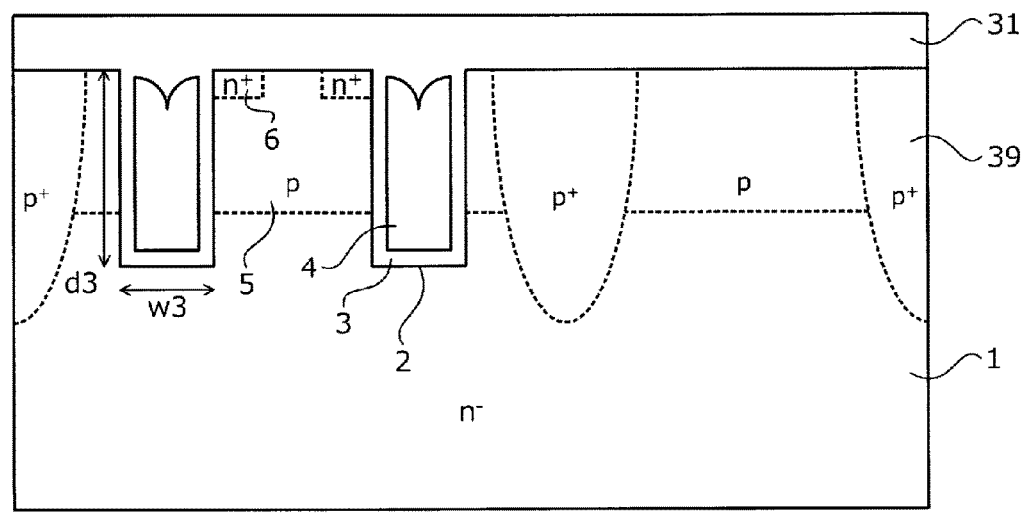
FIG. 16 is a sectional view showing a condition in which the semiconductor device according to the second embodiment is in the process of being manufactured.

Next, a description will be given, with the case of fabricating (manufacturing) an IGBT of a 1200V breakdown voltage level as an example, of a method of manufacturing the semiconductor device according to the second embodiment. FIGS. 16 to 21 are sectional views showing a condition in which the semiconductor device according to the second embodiment is in the process of being manufactured. Firstly, as shown in FIG. 16, the p-type base region 5 and the floating $p^+$-type region 39 are formed on the front surface side of the $n^-$-type semiconductor wafer forming the $n^-$-type drift layer 1, in the same way as in the first embodiment. Next, after removing an oxide film used as an ion implantation mask, an oxide film (not shown) is formed again on the top of the p-type base region 5 and floating $p^+$-type region 39.

Next, a portion of the oxide film corresponding to a region in which to form the first trench 2 is removed by photolithography and etching. Next, anisotropic dry etching is performed with the remaining portion of the oxide film as a mask, thus forming the first trench 2. The width w3 of the first trench 2 may be, for example, on the order of 0.1 μm or more and 1.5 μm or less. The depth d3 of the first trench 2 may be, for example, on the order of 1.0 μm or more and 6.0 μm or less. Next, the gate insulating film 3, the gate electrode 4, and the $n^+$-type emitter region 6 are formed in order, in the same way as in the first embodiment. Next, an oxide film 31 of a thickness of, for example, on the order of 0.1 μm or more and 6.0 μm or less is formed on the front surface of the wafer by, for example, a CVD method.

Figure 17:
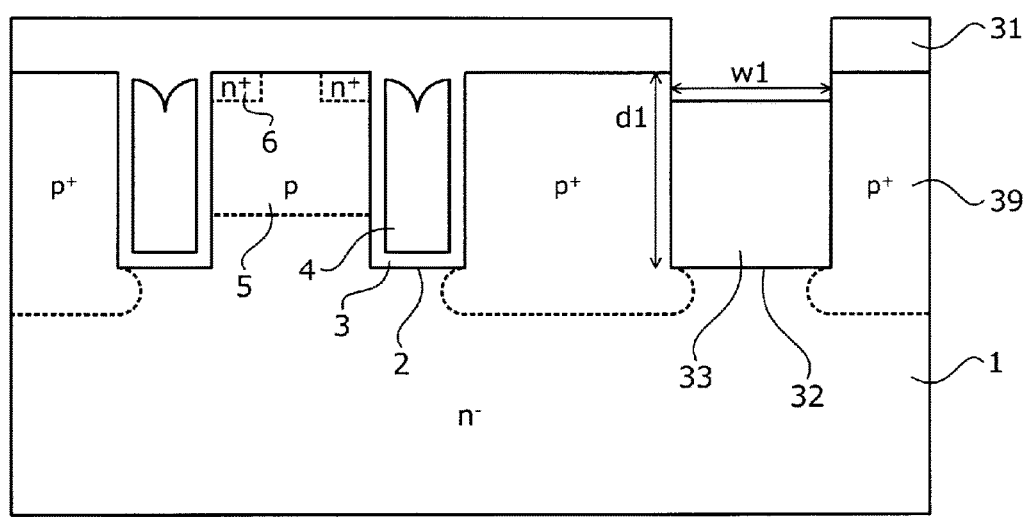
FIG. 17 is a sectional view showing a condition in which the semiconductor device according to the second embodiment is in the process of being manufactured.

Next, as shown in FIG. 17, a portion of the oxide film 31 corresponding to a region in which to form the second trench 32 is removed by photolithography and etching. Next, anisotropic dry etching is performed with the remaining portion of the oxide film 31 as a mask, thus forming the second trench 32 which passes through the p-type base region 5 and reaches the $n^-$-type drift layer 1. The width w1 of the second trench 32 may be, for example, on the order of 1.0 μm or more and 20.0 μm or less. The depth d1 of the second trench 32 may be, for example, on the order of 0.5 μm or more and 6.0 μm or less.

Figure 18:
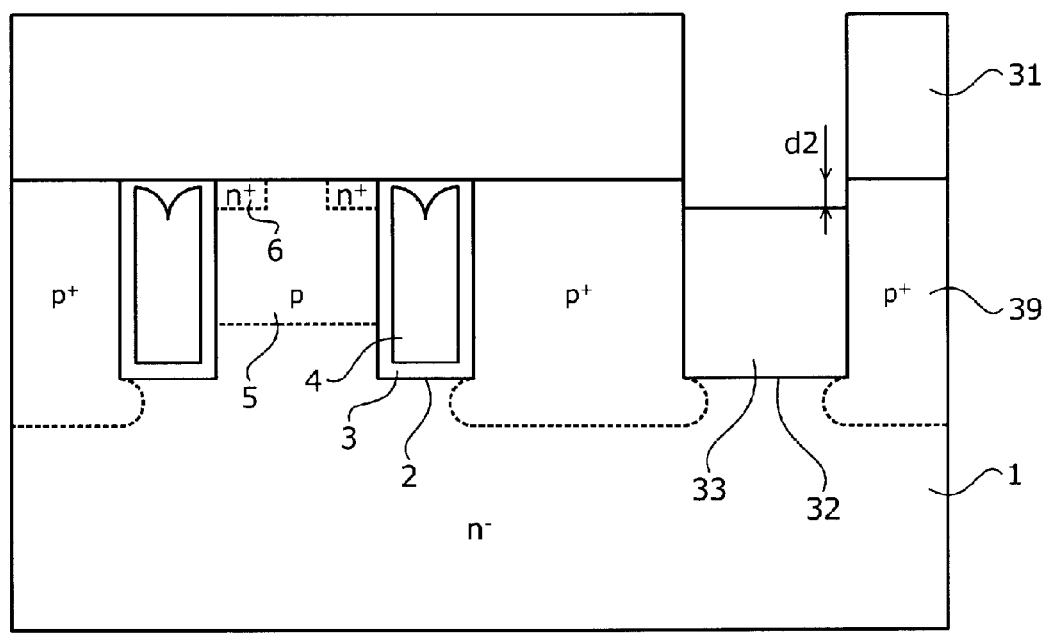
FIG. 18 is a sectional view showing a condition in which the semiconductor device according to the second embodiment is in the process of being manufactured.

Next, as shown in FIG. 18, an oxide film forming insulating layer 33 is embedded into the whole of the inner portion of the second trench 32. At this time, as the oxide film is also deposited on the front surface of the wafer, the thickness of the oxide film 31 on the front surface of the wafer increases. The insulating film 33 may be formed by thermal oxide film growth resulting from activation annealing of the floating $p^+$-type region 39, to be described hereafter. Next, the floating $p^+$-type region 39 is activated by activation anneal. By so doing, the floating $p^+$-type region 39 is diffused in a direction parallel to the principal surface of the wafer (a horizontal direction) and reaches the sidewalls of the first and second trenches 2 and 32, and is diffused in a depth direction (a vertical direction) and becomes deeper than the depth of the second trench 32. The p-type base region 5 remains in a portion sandwiched between the adjacent first trenches 2.

Figure 19:
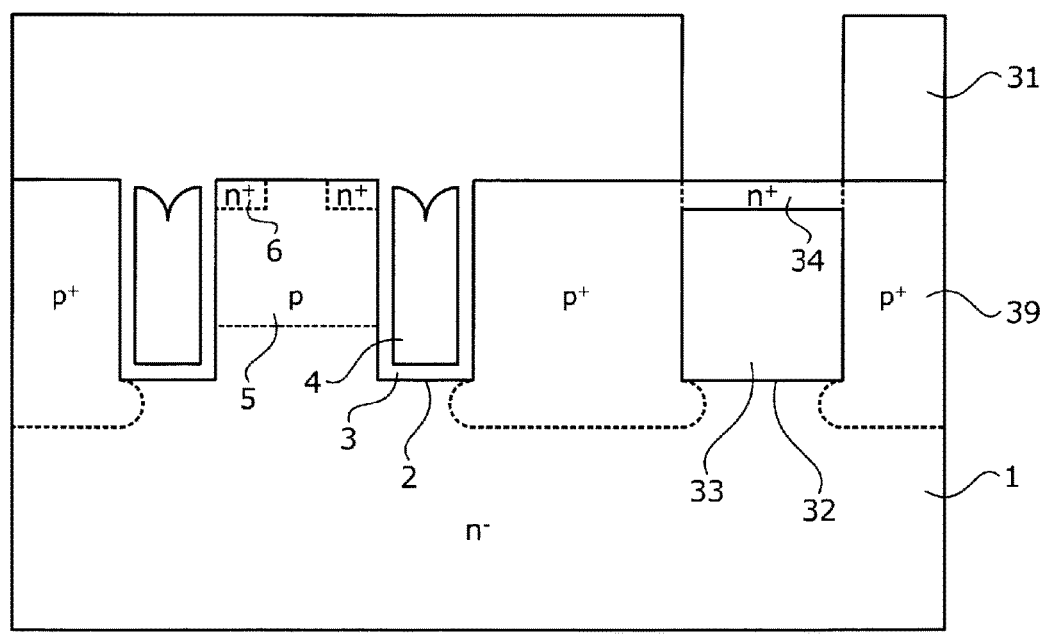
FIG. 19 is a sectional view showing a condition in which the semiconductor device according to the second embodiment is in the process of being manufactured.

Next, the front surface layer of the insulating layer 33 embedded in the inner portion of the second trench 32 is removed to a depth d2 of, for example, on the order of 0.005 μm or more and 0.2 μm or less from the front surface of the wafer (the front surfaces of the p-type base region 5 and floating $p^+$-type region 39) by photolithography and etching. Next, as shown in FIG. 19, the $n^+$-type region 34 is formed on the top of the insulating film 33 remaining in the inner portion of the second trench 32 by epitaxial growth or by depositing a polysilicon film. The impurity concentration of the n⁺-type region 34 may be, for example, on the order of $1.0 \times 10^{15}/cm^3$ or more and $1.0 \times 10^{19}/cm^3$ or less.

Figure 20:
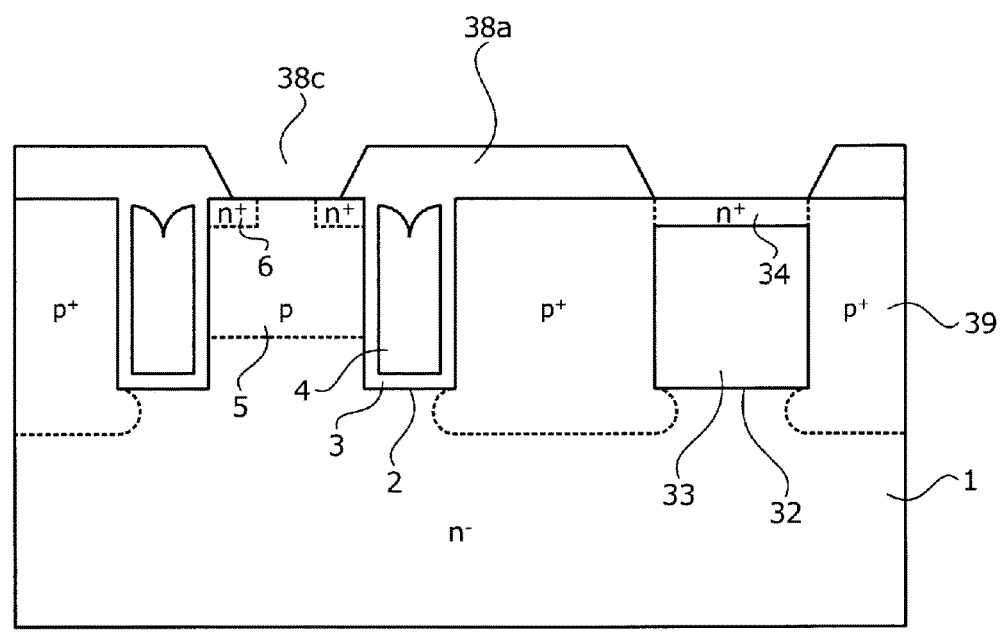
FIG. 20 is a sectional view showing a condition in which the semiconductor device according to the second embodiment is in the process of being manufactured.

Next, as shown in FIG. 20, after removing the oxide film 31 on the front surface of the wafer, an oxide film, forming the first interlayer insulating film 38a, of a thickness of, for example, on the order of 0.1 μm or more and 6.0 μm or less is formed by, for example, a CVD method. Next, the first interlayer insulating film 38a is selectively removed by photolithography and etching, thus exposing the p-type base region 5, n⁺-type emitter region 6, and n⁺-type region 34, and the first interlayer insulating film 38a is left on the top of the gate electrode 4 and on the top of the floating p⁺-type region 39. At this time, an opening portion through which to expose the p-type base region 5 and n⁺-type emitter region 6 forms the first contact hole 38c.

Figure 21:
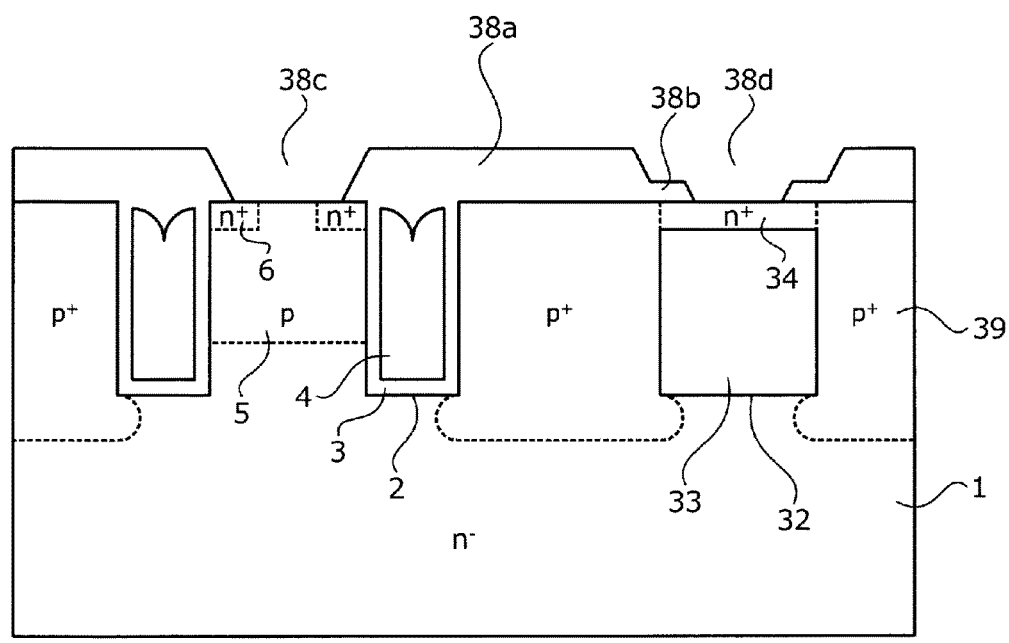
FIG. 21 is a sectional view showing a condition in which the semiconductor device according to the second embodiment is in the process of being manufactured.

Next, as shown in FIG. 21, an oxide film, forming the second interlayer insulating film 38b, of a thickness of, for example, on the order of 0.005 μm or more and 0.2 μm or less is formed on the top of the n⁺-type region 34. Next, the second contact hole 38d through which to expose the n⁺-type region 34 is formed in the second interlayer insulating film 38b by photolithography and etching. Next, the emitter electrode 37 formed of, for example, aluminum is formed on the front surfaces of the first and second interlayer insulating films 38a and 38b so as to be embedded in the first and second contact holes 38c and 38d. Subsequently, after protecting the front surface of the wafer with, for example, a resist film, the steps subsequent to the grinding of the rear surface of the semiconductor wafer are carried out in order, in the same way as in the first embodiment, thus completing the IGBT chip shown in FIG. 15.

As heretofore described, according to the second embodiment, as the emitter electrode and the floating p⁺-type region are electrically connected by the n⁺-type region forming the current path for causing the holes accumulated in the floating p⁺-type region to flow to the emitter electrode when turning on, it is possible to obtain the same advantageous effects as in the first embodiment.

Third Embodiment

Figure 22:
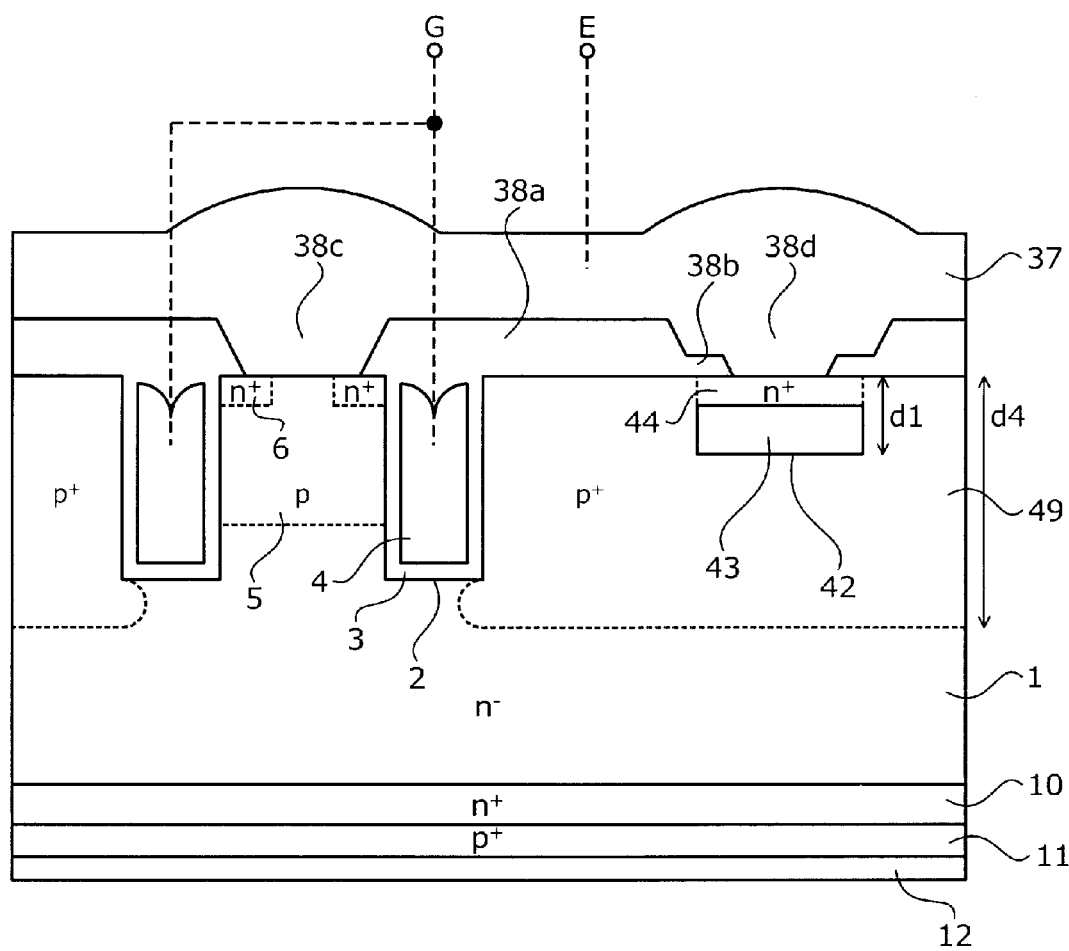
FIG. 22 is a sectional view showing a structure of a semiconductor device according to a third embodiment.

Next, a description will be given of a structure of a semiconductor device according to a third embodiment. FIG. 22 is a sectional view showing a structure of the semiconductor device according to the third embodiment. The semiconductor device according to the third embodiment is different from the semiconductor device according to the second embodiment in that the depth d1 of a second trench 42 is shallower than a depth d4 of a floating p⁺-type region 49. That is, the second trench 42 is provided in the floating p⁺-type region 49 so as to have the depth d1 which does not pass through the floating p⁺-type region 49 from the front surface of the substrate (chip). In FIG. 22, sign 43 is an insulating layer which is the lower layer portion of the inner portion of the second trench 42, and sign 44 is an n⁺-type region which is the upper layer portion of the inner portion of the second trench 42.

As heretofore described, according to the third embodiment, as the emitter electrode and the floating p⁺-type region are electrically connected by the n⁺-type region forming the current path, it is possible to obtain the same advantageous effects as in the first and second embodiments, even when the depth of the second trench wherein the n⁺-type region forming the current path for causing the holes accumulated in the floating p⁺-type region to flow to the emitter electrode when turning on is provided in the upper layer portion is shallower than the depth of the floating p⁺-type region.

Fourth Embodiment

Figure 23:
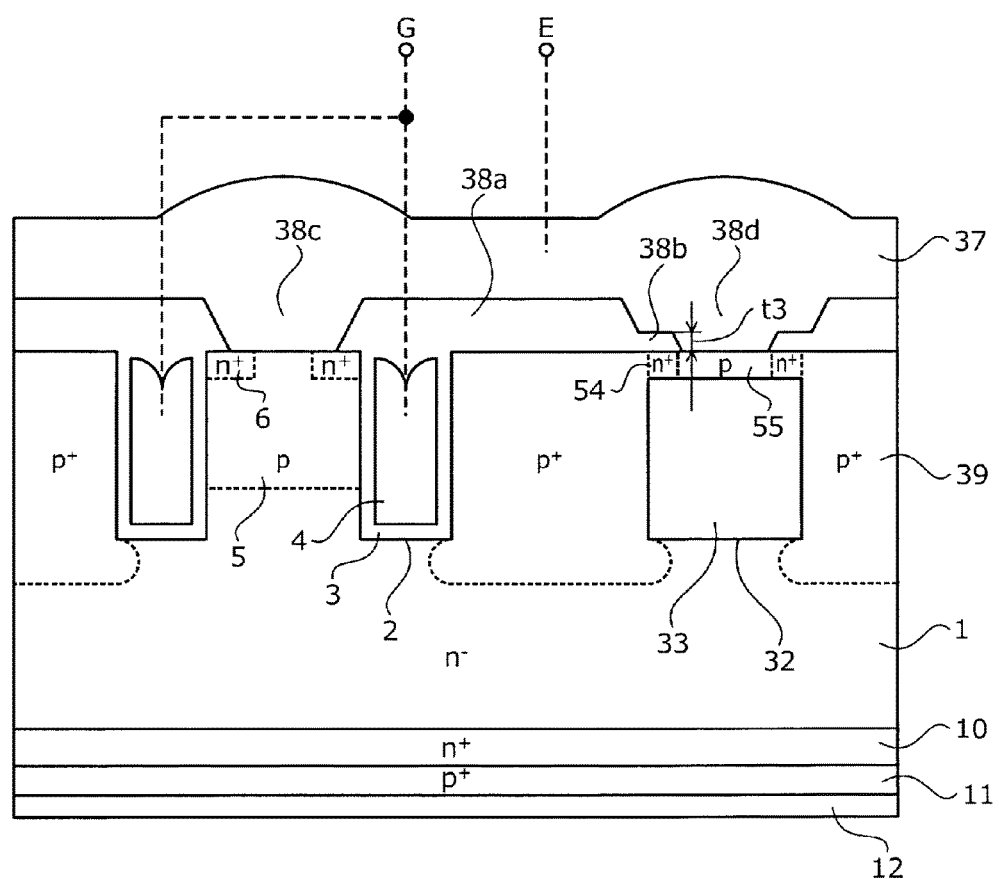
FIG. 23 is a sectional view showing a structure of a semiconductor device according to a fourth embodiment.

Next, a description will be given of a structure of a semiconductor device according to a fourth embodiment. FIG. 23 is a sectional view showing a structure of the semiconductor device according to the fourth embodiment. The semiconductor device according to the fourth embodiment is different from the semiconductor device according to the second embodiment in that an n⁺-type region 54 forming the current path for causing the holes accumulated in the floating p⁺-type region 39 to flow to the emitter electrode 37 when turning on is electrically connected to the emitter electrode 37 via a p-type region (a fifth semiconductor region) 55 other than the p-type base region 5 (other than the channel region).

Specifically, apart from the n⁺-type region 54 forming the current path for causing the holes accumulated in the floating p⁺-type region 39 to flow to the emitter electrode 37 when turning on, for example, the p-type region 55 in contact with the n⁺-type region 54 is provided on the top of the insulating layer 33 of the inner portion of the second trench 32. The p-type region 55 on the top of the insulating layer 33, being disposed, for example, on the central side of the insulating layer 33 relative to the n⁺-type region 54, is electrically connected to the floating p⁺-type region 39 via the n⁺-type region 54. Also, the p-type region 55 is in contact with the emitter electrode 37, for example, via the second contact hole 38d provided in the second interlayer insulating film 38b. The fourth embodiment may be applied to the third embodiment. In the fourth embodiment, it is good that the thickness t3 of the second interlayer insulating film 38b covering the n⁺-type region 54 forming the current path is, for example, 0.005 μm or more in order to provide a dielectric strength voltage, and is, for example, on the order of 0.2 μm or less in order to increase an electric field flowing from the emitter electrode 37 to the n⁺-type region 54 via the second interlayer insulating film 38b.

As heretofore described, according to the fourth embodiment, it is possible to obtain the same advantageous effects as in the first to third embodiment.

In the above, the invention can be variously modified, and in each heretofore described embodiment, the dimensions, surface concentration, and the like, of each portion are variously set in accordance with required specifications or the like. Also, in each embodiment, the first conductivity type is n-type, and the second conductivity type is p-type, but the invention works out in the same way even when the first conductivity type is p-type and the second conductivity type is n-type.

As in the above, the semiconductor device according to the invention is useful for a semiconductor device used in a power conversion device, such as a converter or an inverter, a power supply device for each kind of industrial machine, and the like.

What is claimed is:

1. A semiconductor device, comprising:
   a first conductivity type first semiconductor layer;
   a first trench provided to a predetermined depth in a depth direction from one principal surface of the first semiconductor layer;
   a gate electrode provided in the inner portion of the first trench via a first insulating film;
   a second conductivity type first semiconductor region provided in the surface layer of the one principal surface of the first semiconductor layer so as to have a depth shallower than that of the first trench and to be in contact with the first insulating film provided on the sidewall of the first trench;

a first conductivity type second semiconductor region provided in an inner portion of the first semiconductor region;

a second conductivity type third semiconductor region provided, spaced from the first semiconductor region, in the surface layer of the one principal surface of the first semiconductor layer;

one of (a) a first conductivity type fourth semiconductor region that has an impurity concentration that is higher than that of the first semiconductor layer, or (b) a second conductivity type fourth semiconductor region that has an impurity concentration that is lower than that of the third semiconductor region, and that is provided in the surface layer of the one principal surface of the first semiconductor layer so as to be in contact with the first semiconductor region and third semiconductor region;

a second insulating film covering the fourth semiconductor region;

a first electrode provided in contact with the first semiconductor region and the second semiconductor region and on the top of the second insulating film;

a second conductivity type second semiconductor layer provided on another principal surface of the first semiconductor layer; and a second electrode in contact with the second semiconductor layer.

2. The semiconductor device according to claim 1, further comprising a second trench provided between the first semiconductor region and the third semiconductor region; and an insulating layer that is in contact with the first semiconductor region, the third semiconductor region, and the first semiconductor layer, and that is provided in the inner portion of the second trench, wherein the fourth semiconductor region is provided, on the top of the insulating layer, in the inner portion of the second trench.

3. The semiconductor device according to claim 2, wherein the second trench has a width that is 1.5 µm or less.

4. The semiconductor device according to claim 2, wherein the second trench has a depth that is 6.0 µm or less.

5. The semiconductor device according to claim 1, wherein the first trench has a depth that is 6.0 µm or less.

6. The semiconductor device according to claim 1, wherein the second insulating film has a thickness that is 0.2 µm or less.

7. The semiconductor device according to claim 1, wherein the fourth semiconductor region is of a first conductivity type and has an impurity concentration that is $1.0\times10^{15}/cm^3$ or more and $1.0\times10^{19}/cm^3$ or less.

8. The semiconductor device according to claim 1, wherein the fourth semiconductor region is of a second conductivity type and has an impurity concentration that is $1.0\times10^{18}/cm^3$ or more and $1.0\times10^{19}/cm^3$ or less.

9. The semiconductor device according to claim 1, wherein the fourth semiconductor region is in contact with the second insulating film.

* * * * *